United States Patent
Balaschak et al.

(10) Patent No.: US 8,936,690 B2
(45) Date of Patent: Jan. 20, 2015

(54) APPARATUS AND METHOD FOR LARGE AREA HERMETIC ENCAPSULATION OF ONE OR MORE ORGANIC LIGHT EMITTING DIODES (OLEDS)

(75) Inventors: Edward James Balaschak, Cleveland, OH (US); James Michael Kostka, Cincinnati, OH (US); Thomas Alexander Knapp, Cleveland, OH (US); Keith Raymond Woerner, Canadaigua, NY (US)

(73) Assignee: General Electric Company, Schenectady, NY (US)

( * ) Notice: Subject to any disclaimer, the term of this patent is extended or adjusted under 35 U.S.C. 154(b) by 361 days.

(21) Appl. No.: 13/237,471

(22) Filed: Sep. 20, 2011

(65) Prior Publication Data

US 2013/0068374 A1 Mar. 21, 2013

(51) Int. Cl.
  *B32B 37/00* (2006.01)
  *B32B 37/10* (2006.01)
  *H01L 31/048* (2014.01)
  *H01L 51/52* (2006.01)

(52) U.S. Cl.
  CPC ............. *B32B 37/10* (2013.01); *H01L 31/048* (2013.01); *B32B 37/003* (2013.01); *H01L 51/5237* (2013.01); *B32B 2305/34* (2013.01); *B32B 2309/06* (2013.01); *B32B 2457/12* (2013.01); *B32B 2457/206* (2013.01); *Y02E 10/50* (2013.01)
  USPC .......................... 156/163; 156/164; 156/308.2

(58) Field of Classification Search
  USPC ................. 156/160, 163, 164, 308.2
  See application file for complete search history.

(56) References Cited

U.S. PATENT DOCUMENTS

| | | | | | |
|---|---|---|---|---|---|
| 5,273,608 | A | * | 12/1993 | Nath ............................ | 156/301 |
| 5,288,357 | A | * | 2/1994 | Yamada et al. ............... | 156/249 |
| 5,310,442 | A | | 5/1994 | Ametani | |
| 5,637,177 | A | * | 6/1997 | Os ................................ | 156/286 |
| 5,961,768 | A | * | 10/1999 | Tsujimoto .................... | 156/285 |
| 6,583,848 | B2 | * | 6/2003 | Hashimoto et al. .......... | 349/187 |
| 7,015,640 | B2 | | 3/2006 | Schaepkens et al. | |
| 7,135,352 | B2 | * | 11/2006 | Yokajty et al. ................. | 438/68 |
| 7,397,183 | B2 | | 7/2008 | Schaepkens et al. | |
| 8,343,794 | B2 | * | 1/2013 | Frolov et al. .................. | 438/63 |
| 2004/0016506 | A1 | | 1/2004 | Sakayori et al. | |
| 2009/0289381 | A1 | | 11/2009 | Burmeister et al. | |

FOREIGN PATENT DOCUMENTS

EP 2123420 A2 11/2009

OTHER PUBLICATIONS

PCT Search Report and Written Opinion issued in connection with corresponding Application No. PCT/US2012/053888 dated Jan. 2, 2013.

* cited by examiner

*Primary Examiner* — Jeff Aftergut
(74) *Attorney, Agent, or Firm* — GE Global Patent Oeration; Peter T. DiMauro

(57) ABSTRACT

Apparatus and method for hermetically encapsulating one or more optoelectronic device, such as a light emitting device or a photovoltaic device. The apparatus comprises a base and a carriage movable along the base. The carriage comprises a roller. The apparatus further comprises a vacuum platen coupled with the base and a tensioner coupled with the base. The tensioner comprises a support member that projects orthogonally above a plane of the vacuum platen.

8 Claims, 21 Drawing Sheets

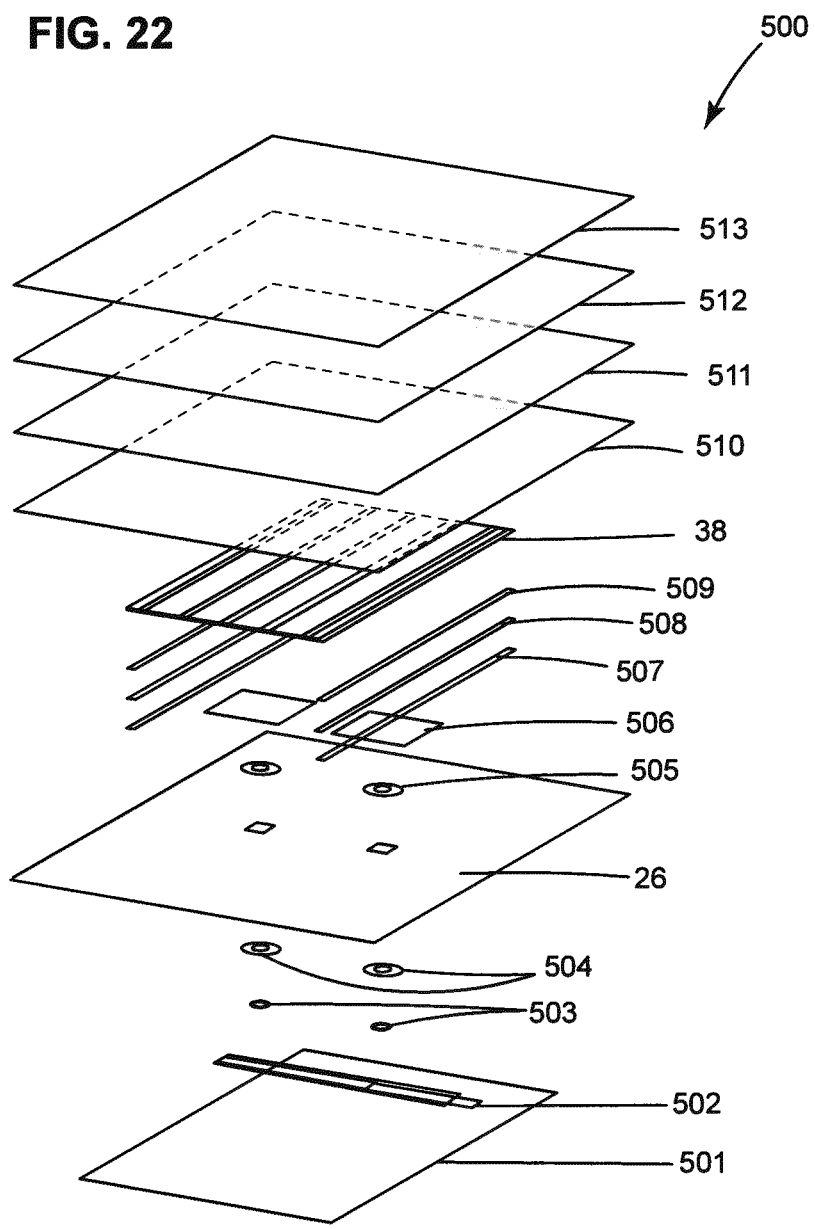

APPARATUS AND METHOD FOR LARGE AREA HERMETIC ENCAPSULATION OF ONE OR MORE ORGANIC LIGHT EMITTING DIODES (OLEDS)

BACKGROUND OF THE INVENTION

1. Field of the Invention

The field of the invention relates to optoelectronic devices generally, and more particularly to certain new and useful advances in the manufacture and roll lamination of encapsulated optoelectronic devices.

2. Description of Related Art

Optoelectronic devices generally comprise light emitting devices and photovoltaic devices. Both types of optoelectronic devices comprise an active layer sandwiched between two electrodes, at least one of which is usually transparent. In a light emitting device, a voltage applied between the two electrodes generates electrical current through the active layer, which causes the active layer to emit light. In a photovoltaic device, such as a solar cell, the active layer absorbs energy from light and converts this absorbed energy to electrical energy, which is evidenced as a voltage and/or a current between the two electrodes.

The active layer is either an inorganic or organic electroluminescent material. One type of popular and useful light emitting device is the organic light emitting diode (OLED). Similar to inorganic light emitting diodes (LEDs), OLEDs are also a form of solid state lighting that offer high efficacies and long lifetimes. An OLED is typically a thin-film structure formed on a substrate comprising glass or transparent plastic. This thin-film structure comprises at least the three layers described above, and may further comprise optional semiconductor layers formed adjacent the active layer. These semiconductor layers may be incorporated to facilitate the injection and transport of holes (positive charge) or electrons (negative charge).

Glass substrates offer transparency and low permeability to oxygen, water vapor and/or other reactive species, which can cause corrosion and/or degradation of the optoelectronic device; but are typically not suitable for applications where flexibility is required. Plastic substrates offer flexibility and the potential for low cost roll production, but typically have a high permeability to oxygen, water vapor and/or other reactive species. Accordingly, OLED devices comprising plastic substrates are typically encapsulated with one or more layers of barrier films that block oxygen, water vapor and/or other reactive species. The composition and methods of making conventional ultra-high barrier (UHB) films, or UHBs, are described in U.S. Pat. No. 7,015,640 and U.S. Pat. No. 7,397,183, both assigned to the General Electric Company.

Many optoelectronic functional materials that are currently used are extremely sensitive to oxygen and moisture, and it is therefore necessary to hermetically seal the devices under an inert environment. This is typically done in a dry box, with purified nitrogen or argon as the working gas. It is preferable to have oxygen and moisture contents below 10 parts per million during the encapsulation process, although this is not deemed to be limiting.

OLEDs, their barrier films and/or backsheets can be damaged in conventional roll manufacturing. This is of particular concern for the barrier film that is used to hermetically seal the OLED, as damage induced during a roll-to-roll process may cause defects concomitant with an increased permeability of the films. This will result in a decreased shelf life of the encapsulated device. For example, FIG. 1 illustrates bi-directional compressive forces 13 and 14 that are applied during a conventional roll fabrication process to an OLED 18 that is sandwiched between a front sheet 15 and a backsheet 16. The opposing, parallel rollers 11 and 12 of a roll laminator 10 apply the bi-directional compressive forces 13 and 14, respectively, to the front sheet 15 and the backsheet 16. This causes the front sheet 15 and/or the backsheet 16 to deform to create an edge seal around the OLED device 18. However, deformation of the front sheet 15 around the perimeter of the OLED device 18 can create stress areas. Over time, portions of these stress areas may exhibit cracking of the front sheet 15 and/or loss of its barrier properties. In FIG. 1, the material fed through the rollers 11 and 12 moves in the direction indicated by arrow 17.

Thus, there is a need for an improved thin flexible packaging technology for expanded application of low cost production of encapsulated optoelectronic devices.

Currently, manufacturing capabilities and material property limitations constrain the size of individual organic light emitting devices (OLEDs) to a relatively small dimension. By relatively small dimension is meant an area on the order of centimeters squared, when contrasted with a large area lighting panel greater than this on the order of feet squared or meters squared. Therefore, in order to obtain large area lighting panels, individual OLEDs need to be tiled together to form the larger product.

What are also needed are new tiling and encapsulation equipment and processes that do not diminish OLED performance, and can produce large-area lighting products within a relatively short cycle time.

BRIEF SUMMARY OF THE INVENTION

The present disclosure describes embodiments of encapsulation equipment and encapsulation techniques for producing large area hermetically encapsulated optoelectronic devices with short cycle times. In contrast to the conventional roll laminator described above, which uses fixed rollers to move and compress mobile materials (e.g., a backsheet and front sheet) together, embodiments of the new laminator described and claimed herein move one or more mobile rollers over fixed materials (e.g., a flat front sheet that is positioned on a vacuum platen, which may be heated, and a tensioned backsheet that is positioned at a predetermined angle relative to the front sheet). Temperature control may be applied to one or more of the rollers and/or to the platen. Additionally, the amount of compressive force applied by the one or more rollers can be controlled and/or varied. Additionally, the tension of the backsheet can be controlled and/or adjusted.

Encapsulating an optoelectronic device requires bonding delicate materials that are particularly sensitive to mechanical deformation. Keeping the front sheet stationary and flat during lamination, as embodiments of the invention are configured to do, minimizes stress on the front sheet and/or other components of the optoelectronic device, and achieves a degree of encapsulation that is superior to that which can be achieved using conventional roll lamination equipment and techniques. Consequently, an optoelectronic device manufactured as described herein can have a prolonged operating life and/or enhanced performance.

One benefit is that an embodiment of the laminator and processes disclosed herein enables large-area tiling and hermetic encapsulation of semiconductor devices, which results in products with fewer manufacturing defects and superior shelf life characteristics.

Beneficial features include one or more heaters to heat the platen and/or a roller of a movable assembly before and/or during lamination, use of a tensioned material that has a low coefficient of friction between the front sheet and the platen, selective application of a roller of the movable assembly so that a single portion of the backsheet contacts the front sheet at a time, and/or selective movement of carriage and/or the platen.

Other features and advantages of the disclosure will become apparent by reference to the following description taken in connection with the accompanying drawings.

BRIEF DESCRIPTION OF THE SEVERAL VIEWS OF THE DRAWINGS

Reference is now made briefly to the accompanying drawings, in which:

FIG. 22 is a perspective, exploded view of an illustrative encapsulated optoelectronic device that may be produced using one or more embodiments of the laminator described herein.

Like reference characters designate identical or corresponding components and units throughout the several views, which are not to scale unless otherwise indicated.

DETAILED DESCRIPTION OF THE INVENTION

Figure 1:
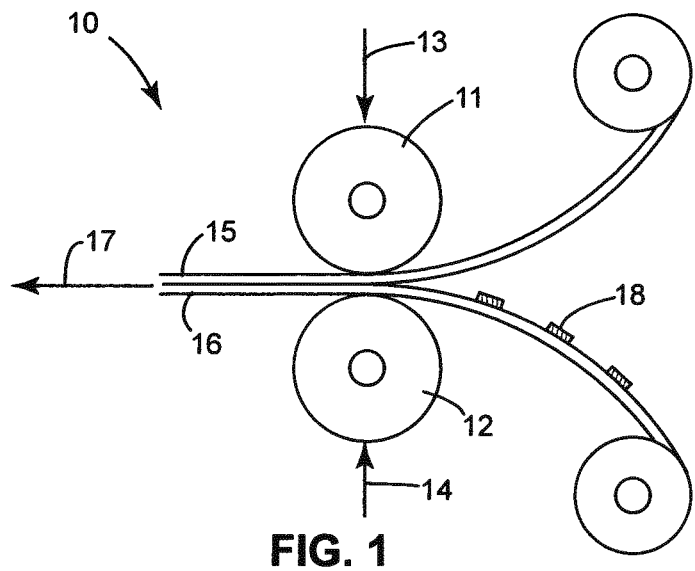
FIG. 1 is a diagram of a conventional roll laminator.
Figure 2:
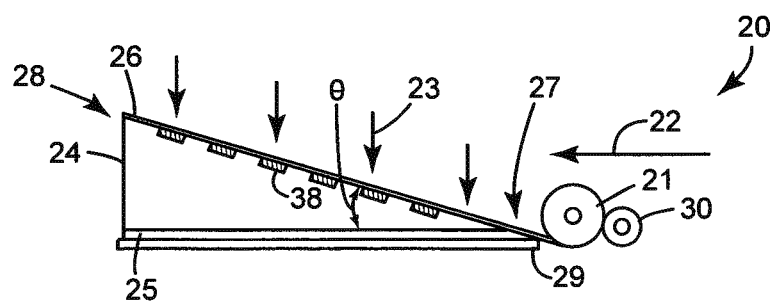
FIG. 2 is a simplified diagram of an embodiment of a new roll laminator that applies compressive force that is substantially unidirectional.

FIG. 2 is a diagram illustrating substantially uni-directional compressive forces 23 applied to a backsheet 26 of an optoelectronic device 38, such as an OLED device or a photovoltaic device, by an embodiment of a new roll laminator 20. The optoelectronic device 38 is positioned between the backsheet 26 and a front sheet 25. The front sheet 25 may comprise a light-transmissive ultra-high barrier (UHB) film, an optical coupler, an out-coupling adhesive, and/or an out-coupling film. A first end 27 of the backsheet 26 is coupled with a clamp (not shown). The opposite second end 28 of the backsheet 26 is coupled with another clamp (not shown) and a tensioner 24 that positions the second end 28 of the backsheet 26 higher than the first end 27 so that the backsheet 26 forms a predetermined angle θ, of a range of predetermined angles, e.g., from about 0° to about 180°, with the front sheet 25. In one embodiment, this range of angles comprises approximately 5 degrees to approximately 10 degrees at the beginning of the cycle. At the end of the cycle, the angle may be as high as 60 degrees. This range of predetermined angles ensures that only a portion of the backsheet 26 touches the front sheet 25 as the roller 21, and optionally roller 30, moves across the backsheet 26, e.g., from the first end 27 to the second end 28 in the direction indicated by the arrow 22. One or more optoelectronic devices 38 are positioned on the backsheet 26 and face downwards, e.g., toward the front sheet 25. Alternatively, the optoelectronic devices 38 are positioned on the front sheet 25.

The front sheet 25 is positioned on a flat surface of a vacuum platen 29, which may be heated to relax and smooth the front sheet 25 and/or to cure a heat-cure adhesive that couples the optoelectronic devices 38 and/or the backsheet 26 to the front sheet 25. Accordingly, in contrast to conventional roll lamination techniques, the front sheet 25 remains flat, and only the backsheet 26 is pressured to conform around the perimeter of the optoelectronic device 38.

Figure 3:
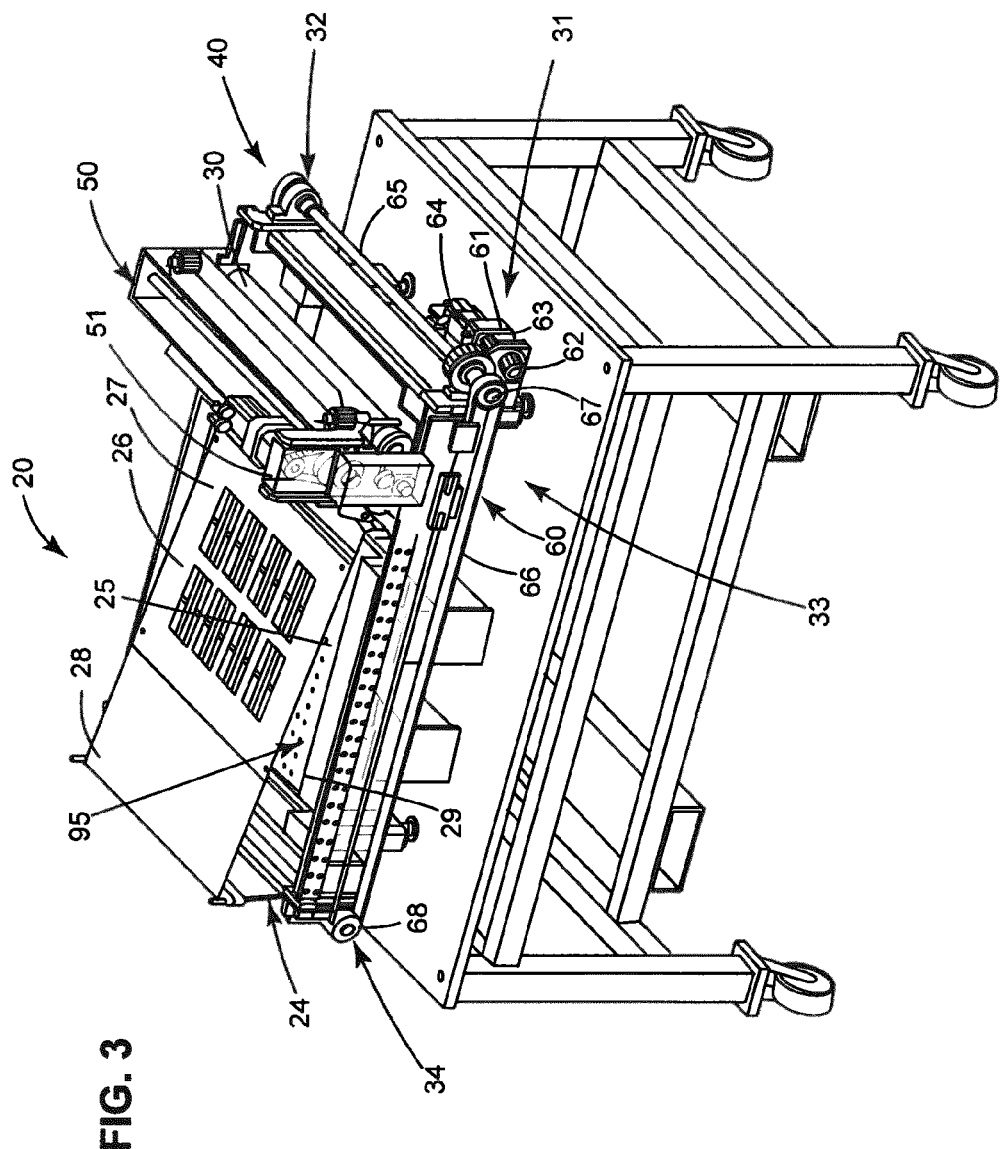
FIG. 3 is a front perspective view of an embodiment of the new roll laminator of FIG. 2.
Figure 4:
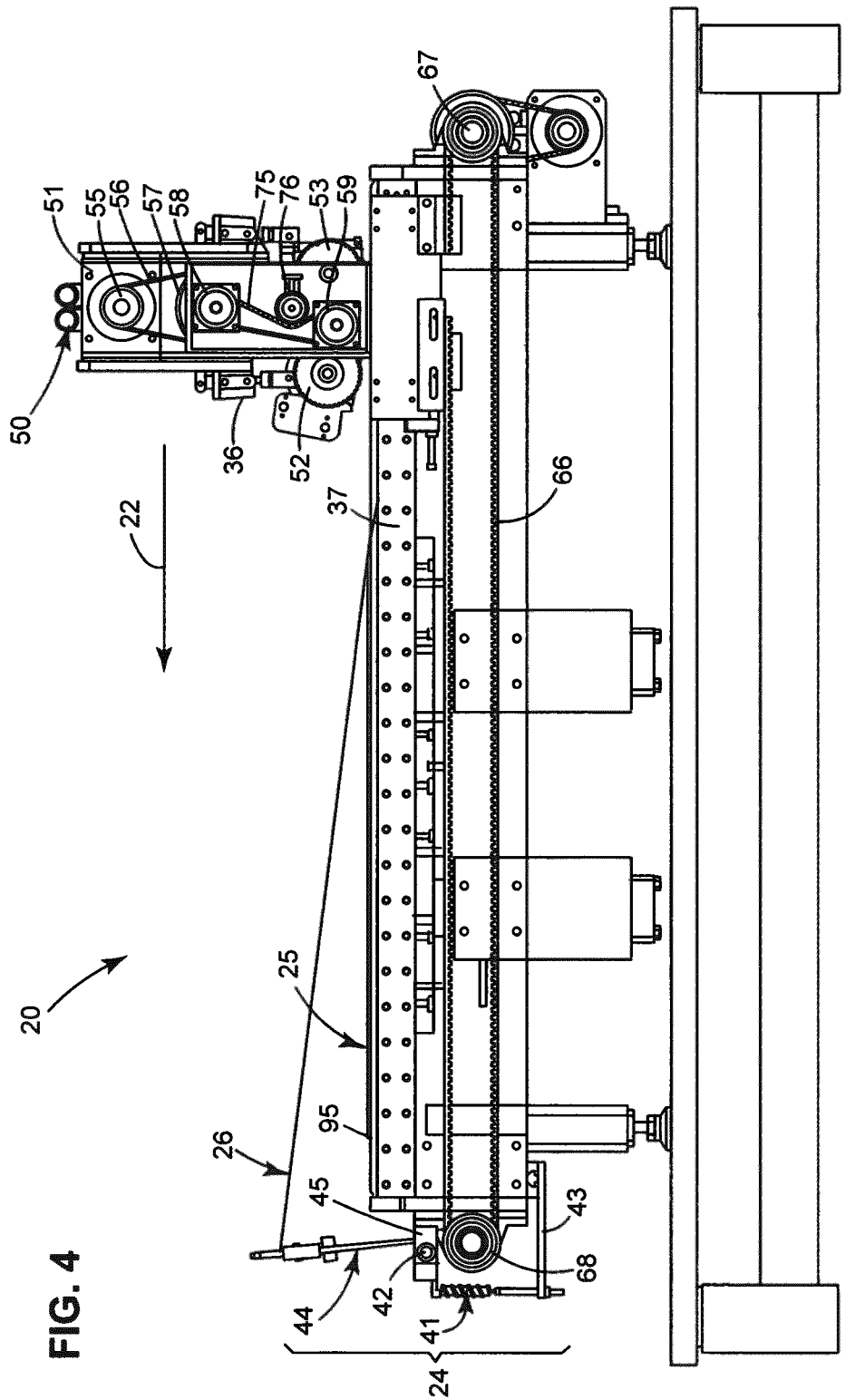
FIG. 4 is a front elevational view of the new roll laminator of FIG. 3.
Figure 5:
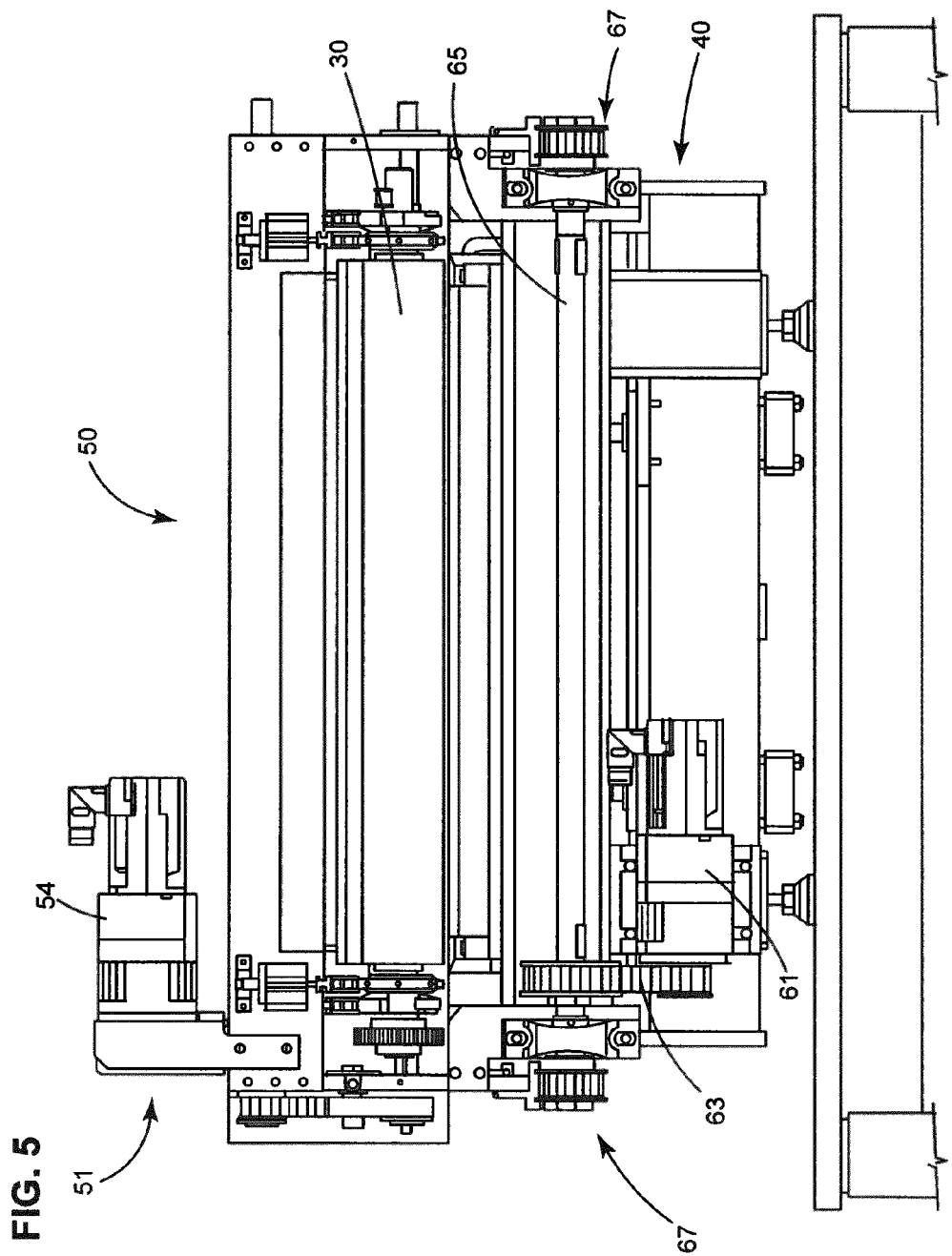
FIG. 5 is a right side elevational view of the new roll laminator of FIG. 3.
Figure 6:
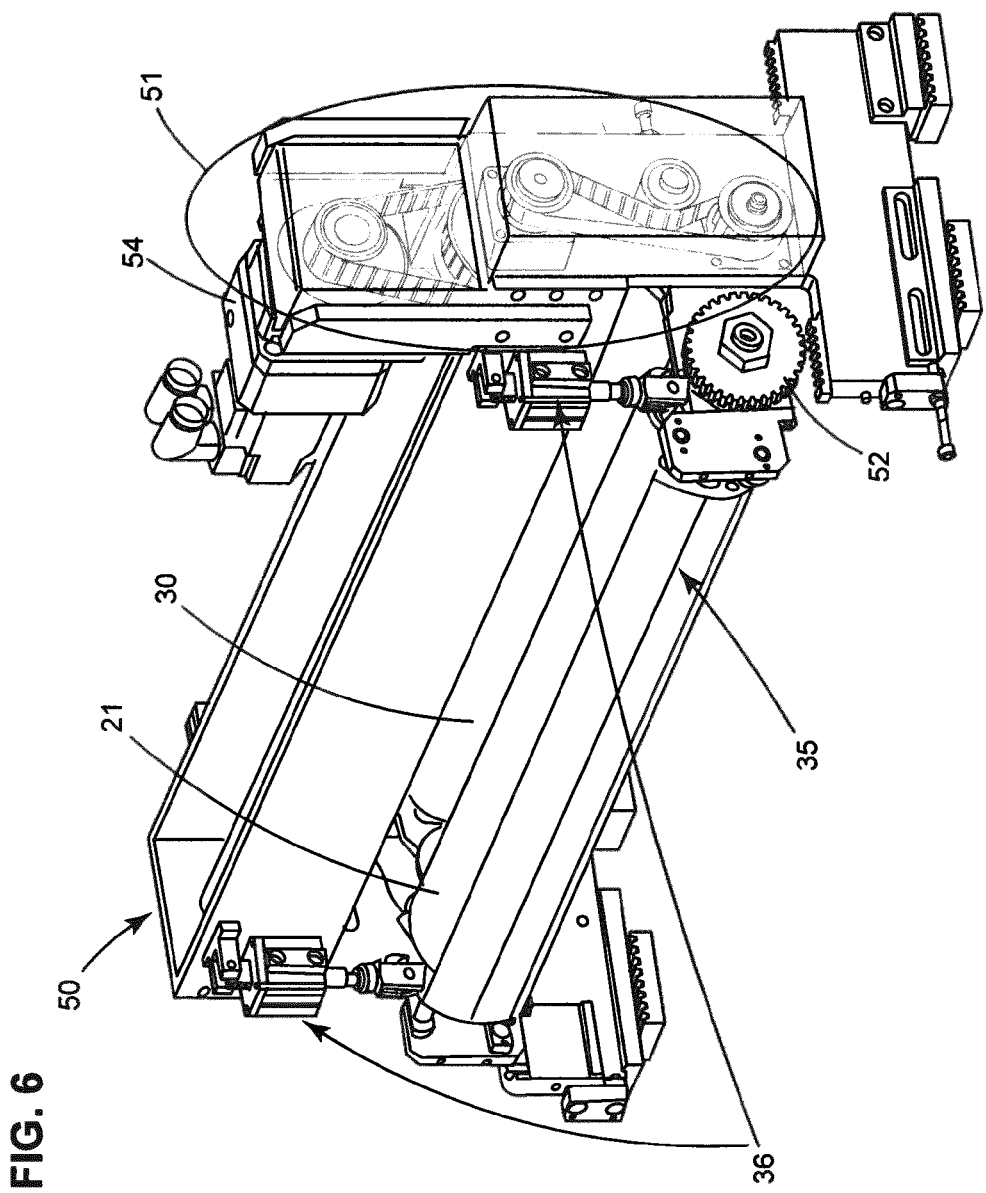
FIG. 6 is a perspective view of a movable assembly of the new roll laminator of FIG. 3.
Figure 7:
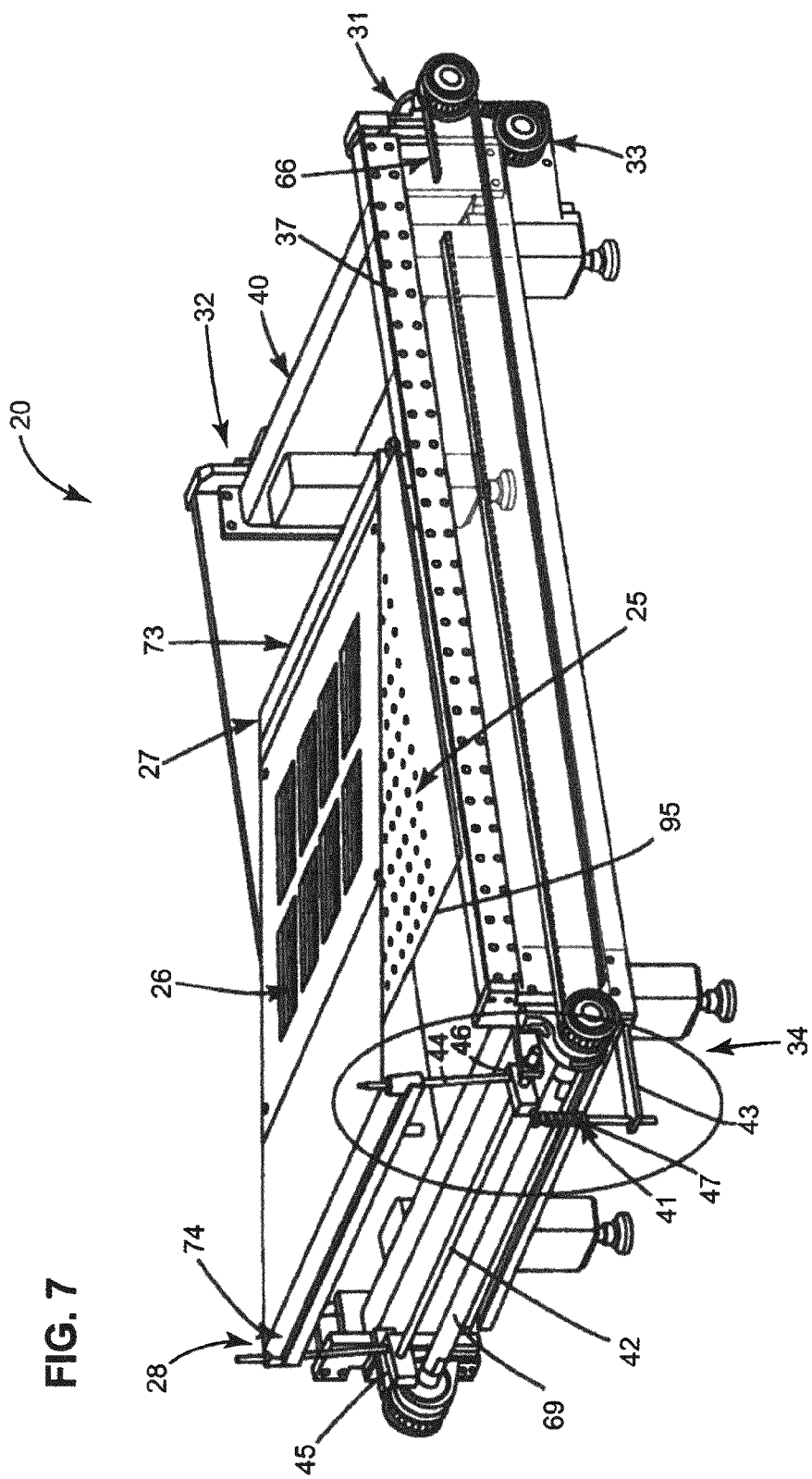
FIG. 7 is another front perspective view of the new roll laminator of FIG. 3, with the movable assembly removed.
Figure 8:
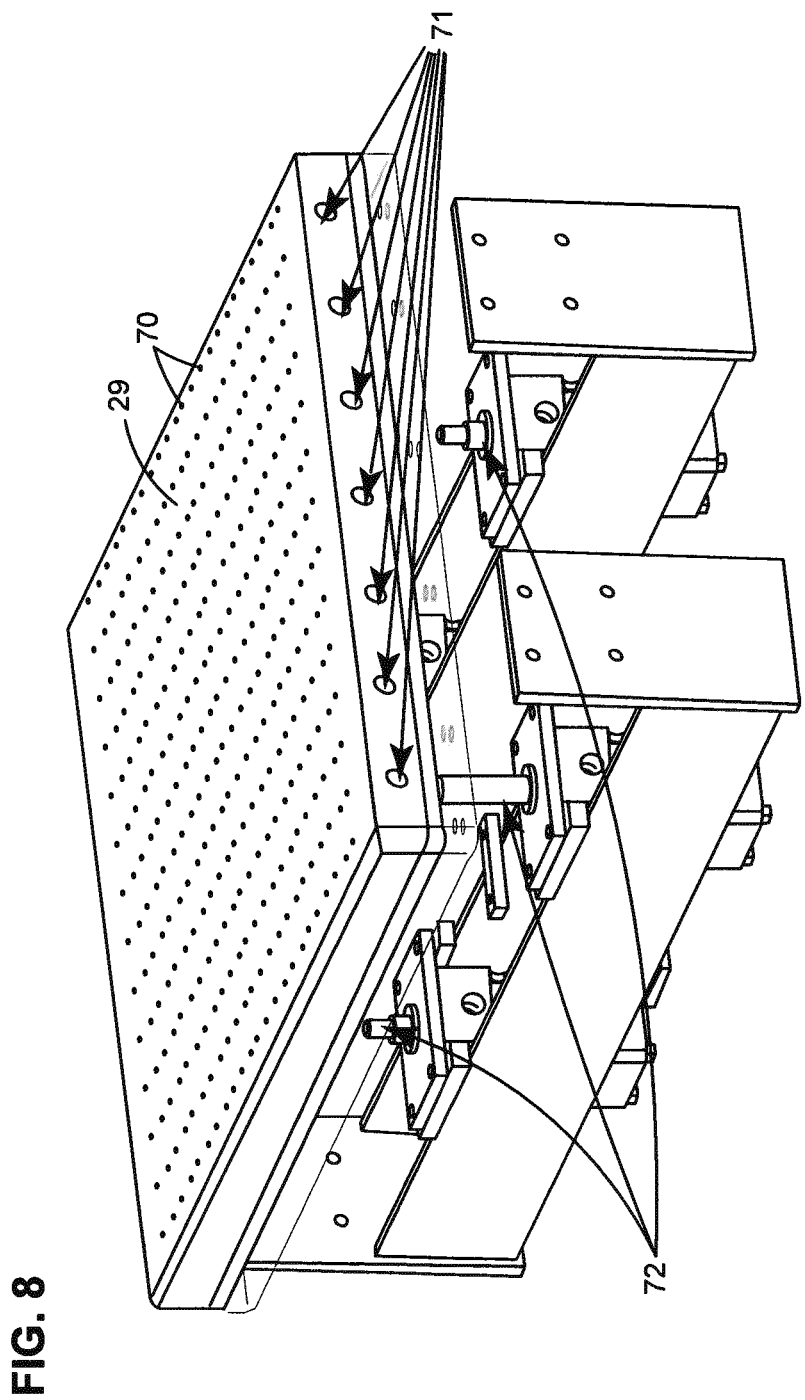
FIG. 8 is a perspective view of a platen of the new roll laminator of FIG. 3.

FIG. 3 is a front perspective view of an embodiment of the new roll laminator 20 of FIG. 2. FIG. 4 is a front elevational view of the new roll laminator 20 of FIG. 3. FIG. 5 is a right side elevational view of the new roll laminator 20 of FIG. 3. FIG. 6 is a perspective view of a movable assembly of the new roll laminator 20 of FIG. 3. FIG. 7 is another front perspective view of the new roll laminator 20 of FIG. 3, with a roller movable assembly removed. FIG. 8 is a perspective view of a platen 29 of the new roll laminator 20 of FIG. 3. In these Figures, the reference numeral 25 points to an area where the transparent front sheet would be. The reference numeral 95 points to a tensioned non-stick sheet, which is perforated with holes in a pattern that matches a pattern of holes in a platen 29. The pattern of holes in the tensioned non-stick sheet 95 allow the vacuum pulled through the holes in the vacuum platen 29 to pass through the tensioned non-stick sheet 95 so that the first sheet of encapsulating material 25 is smoothed against the tensioned non-stick sheet 95 and the top surface of the vacuum platen 29. The non-stick sheet 95 spans from the front side 31 of the laminator 20 to the back side 32 of the laminator 20. Also in these Figures (and in FIG. 9), the optoelectronic devices 38 are attached to the underside of the backsheet 26, and thus are not really visible from the views in FIGS. 3, 7 and 9.

Referring to FIGS. 3, 4, 5, 6, 7, and 8, a roll laminator 20 comprises a base 40, a vacuum platen 29, a first actuator system 60, and a movable assembly 50 that comprises parallel rollers 21 and 30 and a second actuator system 51. This movable assembly 50 may be referred to as a "carriage". Thus, for convenience hereafter, the first actuator system 60 may be referred to as "carriage actuator system 60", and the second actuator system 51 may be referred to as "roller actuator system 51." Both actuator systems 60 and 51 are independent of each other, so that the rollers 21 and 30 can rotate while the carriage 50 is stationary.

The base 40 is generally rectangular and comprises one or more planar support members fastened and/or attached together to form a rigid box frame. The base 40 has a first side 31 and a second side 32, a first end 33 and a second end 34. A first actuator 61 is coupled with the first end 33 of the base 40. The actuator 61 is a motor having a drive gear 62. A drive belt 63 couples the drive gear 62 to a larger gear 64, which is coupled with a first axle 65. The first axle 65 spans the width of the base 40 and is attached to the base 40 by one or more bushings that permit the axle 65 to rotate when the first actuator 61 rotates the drive gear 62 and the attached drive belt 63. Each end of the first axle 65 is coupled with a gear 67. The gear 67 has a smaller diameter than the gear 64. Two additional drive belts 66, one on each side 31, 32 of the base 40, couple the gears 67 with corresponding gears 68 at the second end 34 of the base 40. The gears 68 are coupled with first and second ends, respectively, of a second axle 69 (FIG. 7), which is fastened or attached to the base 40 by one or more bushings. The drive belts 66 are coupled with the carriage 50 so that when the drive belts 66 are rotated the carriage 50 moves longitudinally along a length of the laminator 20. The drive train described may alternatively be substituted for any appropriate driving mechanism for linear travel, e.g. chain drive, cable drive, hydraulic drive, pneumatic drive, power screw, linear motor, or other linear actuator.

The base 40 supports the vacuum platen 29, which provides a flat surface for the front sheet 25 (and optional sheet having a low coefficient of friction). The vacuum platen 29 may have one or more heaters 71 (FIG. 8) and/or cooling passages therein, and may be made of a highly thermally conductive material to speed cycle times. Referring to FIG. 8, the vacuum platen 29 has a plurality of holes 70 formed therein through which fluid can be drawn to position the front sheet 25 (and optional sheet having a low coefficient of friction) flat against a top surface of the vacuum platen 29 and hold either or both sheets stationary during lamination.

In one embodiment, the transparent front sheet 25 rests on a taut non-stick sheet 95 that comprises a material having a low coefficient of friction. A non-limiting example of such a material is a fluoropolymer, such as polytetrafluoroethylene (PTFE), which forms a non-stick surface. Thus, in one embodiment, the taut non-stick sheet 95 is positioned between the platen 29 and the first sheet 25. The taut non-stick sheet 95 keeps the lamination supported when the platen 29 is moved away from the first sheet 25 by one or more actuators 72 (height control cylinders), and allows the encapsulated optoelectronic devices 38 to be removed. As mentioned above, the taut non-stick sheet 95 has a plurality of holes formed therethrough to allow vacuum pressure applied through the platen 29 to smooth and/or flatten the front sheet 25 against a flat surface of the platen 29.

Thus, the taut non-stick sheet 95 is an element that helps embodiments of the laminator 20 operate cleanly and efficiently. Unless the backsheet 26 and front sheet 25 are identically sized and aligned perfectly, there will be an opportunity for adhesive on either sheet to contact either the roller(s) or the platen 29 during lamination. This is detrimental to maintaining the cleanliness of the laminator 20. Accordingly, in one embodiment, by under-sizing the front sheet 25 (which is sitting flat on the platen 29 with adhesive facing up), only the platen 29 will be exposed to adhesive, which comes from the backsheet (which is tensioned/hovering above the front sheet 25 with adhesive facing down). The use of the taut non-stick sheet 95 keeps the platen 29 protected from backsheet adhesive while allowing vacuum to be pulled through it to hold the front sheet 25. By tensioning the non-stick sheet 95 in a fixed position, the heated platen 29 can be mechanically disengaged from the encapsulated product instead of waiting for cool-down. An alternative way to mitigate the exposure of adhesive to machine parts is to selectively apply the adhesive such that the outer web of both the backsheet 26 and front sheet 25 is dry (i.e. free of adhesive). This is particularly appropriate for roll-to-roll processing (described below), where a taut non-stick sheet 95 is not necessary to support the encapsulated product after the platen 29 disengages.

The actuators 72 are used to drop the platen 29 from the first sheet 25 after encapsulation is complete. The mechanical removal of the heated vacuum platen 29 from the encapsulated optoelectronic devices 38 has two advantages. First, there is no need for heat once encapsulation is complete, and in fact the presence of excessive heat after the cycle is complete can damage the optoelectronic devices 38. Dropping the platen 29 promptly after the cycle completes prevents the optoelectronic devices 38 from overheating. Second, the cycle time is much faster if the platen 29 can remain at laminating temperature rather than cooling between cycles. Since the platen is mechanically removed from the materials, there is no need, in one embodiment, to cool the platen 29 to an idle temperature between cycles.

A first end 27 of the backsheet 26 is held in place by a first clamp 73 (FIG. 7), and the second end 28 of the backsheet 26 is held in place by a second claim 74 (FIG. 7). Together with the tensioner 24, these clamps 73, 74 help ensure the backsheet 26 is properly tensioned during lamination. As best shown in FIGS. 4 and 7, an embodiment of the tensioner 24 comprises two brackets 45 that are coupled on either side 31, 32 of the second end 34 of the base 40. Each bracket 45 has a hole or slot therein that receives a rod 42, which serves as a pivot point for blocks 46 that are coupled with the rod 42. Each block 46 is generally rectangular. A first support member 44 projects orthogonally upwards, e.g., above a plane of the platen 29, from a side of each block 46. The backsheet clamp 74 is coupled with the free ends of the first support members 44. A second support member 41 is coupled with an opposite end of at least one block 46 and extends downwards, e.g., below a plane of the platen 29, to couple with a third support member 43 that is coupled with the base 40. The second support member 41 may comprise a resilient member, such as a spring. In operation, the tensioner 24 controls how much tension is applied to the backsheet 26 while the carriage 50 and the rollers 27, 30 move over the backsheet 26 during lamination.

In one embodiment, the resilient member may be used to adjust the amount of tension. In other embodiments, one or more clamps and/or rollers, separately and/or in combination with each other and/or the resilient member, are used to adjust the amount of tension applied to the backsheet, the front sheet, a sheet positioned between the front sheet and the platen, and/or a sheet positioned between the backsheet and the roller(s). The amount of tension should be high enough that the backsheet, whether populated with optoelectronic devices or not, does not sag and touch the front sheet prior to the roller carriage moving over both sheets.

In one embodiment a working range for the tension is about 0.16 pounds per linear inch to about 0.29 pounds per linear inch of backsheet to be tensioned. This range is provided for illustrative reasons only, it being understood that the exact amount of tension applied will vary depending on a variety of factors, such as, but not limited to: the holding force of the clamps 73 and 74, the starting angle between the front sheet 25 and the backsheet 26, the velocity of the carriage 50 during lamination, the yield strength of the material(s) that comprise the backsheet 26, and the encapsulation temperature of the platen 29 and roller 21, which can lower the yield strength of the encapsulation materials. Accordingly, embodiments of the claimed invention contemplate that the backsheet 26 (and/or the front sheet 25 and/or the taut non-stick sheet 95 between the front sheet 25 and the platen 29) can be tensioned at any suitable amount of tension that is less than the yield strength of the materials(s) comprising it. A further feature of the tensioner 24 is the ability to rotate as the carriage moves forward. This ensures that the amount of tension is roughly constant throughout the lamination cycle.

Turning now to FIGS. 3, 4, 5 and 6, the carriage 50 is movably coupled with the frame 40. In particular, the carriage 50 comprises wheels or casters or bearings (not shown) that roll along a carriage rail 37, which is fastened or attached to the base 40. As mentioned above, the carriage 50 is coupled with the drive belts 66 so that lateral movement of the carriage 50 can be controlled by operation of the actuator 61.

The carriage 50 comprises two parallel rollers 21 and 30 (FIG. 6) that are positioned in approximately the same plane. In other words, rollers 21 and 30 area each generally parallel to a surface of the platen 29. One end of roller 21 is coupled with a drive gear 52, and one end of roller 30 is coupled with a drive gear 53. As shown in FIGS. 4 and 6, a pressure cylinder 36 is positioned at each end of the roller 21 and coupled with a bracket that secures the roller 21 to the carriage 50. Operation of the pressure cylinders 36 controls the amount of substantially uni-directional compressive force (23 in FIG. 2) applied by the rollers 21 and 30 to the backsheet 26 during lamination. The compressive force should be 5-6 pounds per linear inch of roller to provide adequate pressure during lamination without over-compressing the optoelectronic device. Optionally, a roller heater 35 may be provided along a width of the carriage 50 to heat at least the roller 21 during lamination or to pre-heat at least the roller 21 before lamination. Heating at least the roller 21 helps relax and smooth the backsheet 26 as the rollers 21, 30 apply compressive force (23 in FIG. 2). Heating at least the roller 21 may also help cure a heat-cure adhesive applied between the backsheet 26 and the front sheet 25.

The temperature required to produce an acceptable encapsulation will vary. In one embodiment, a typical temperature to couple the front sheet to the backsheet for acceptable encapsulation is about 100° C., where non-PSA encapsulating material is used. In another embodiment, where PSA encapsulating material is used, the typical temperature may be ambient (e.g., room temperature). In another embodiment, where heat seal adhesives (for flexible OLEDs on plastic substrates) are used, the typical temperature may range from about 60° C. to about 200° C.

In one embodiment, the rollers 21 and 30 are rotated by a single actuator assembly, e.g., the actuator assembly 51, which is best shown in FIGS. 4, 5 and 6. The actuator assembly 51 comprises, from the top down, an actuator 54 that is coupled with a drive gear 55. A first belt 56 couples the drive gear 55 to a larger diameter gear 57. A shaft couples the gear 57 to a smaller diameter gear 58. A second belt 75, tensioned by a belt tensioner 76, couples the gear 58 with a slave gear 59. The slave gear 59 engages the drive gear 52 that is coupled with the roller 21. The slave gear 59 also engages the drive gear 53 that is coupled with the roller 30. Alternative roller drive options may include a chain drive, cable drive, direct drive, or other drive mechanism for transmitting rotational force.

Figure 9:
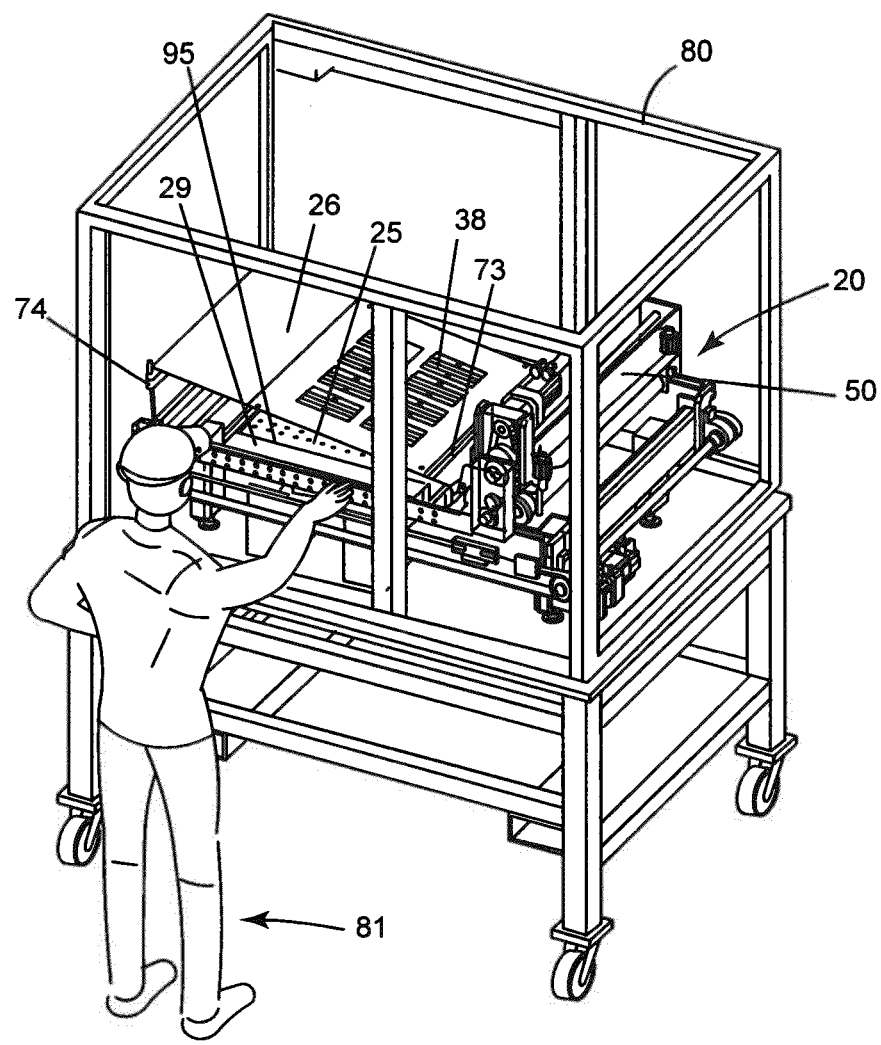
FIG. 9 is a perspective view of an embodiment of the new roll laminator of FIG. 3.

FIG. 9 is a perspective view of an embodiment of the new roll laminator 20 of FIG. 3 in an enclosure 80. An operator 81 is shown loading a front sheet 25 onto the vacuum platen 29; placing the backsheet 26 with the first clamp 73 and the second clamp 74 into position; and operating the laminator 20 to move the carriage 50 over the tensioned backsheet 26 and laminate the backsheet 26 and optoelectronic devices 38 coupled thereto to the front sheet 25 to produce one or more large area hermetically encapsulated optoelectronic device(s).

Figure 10:
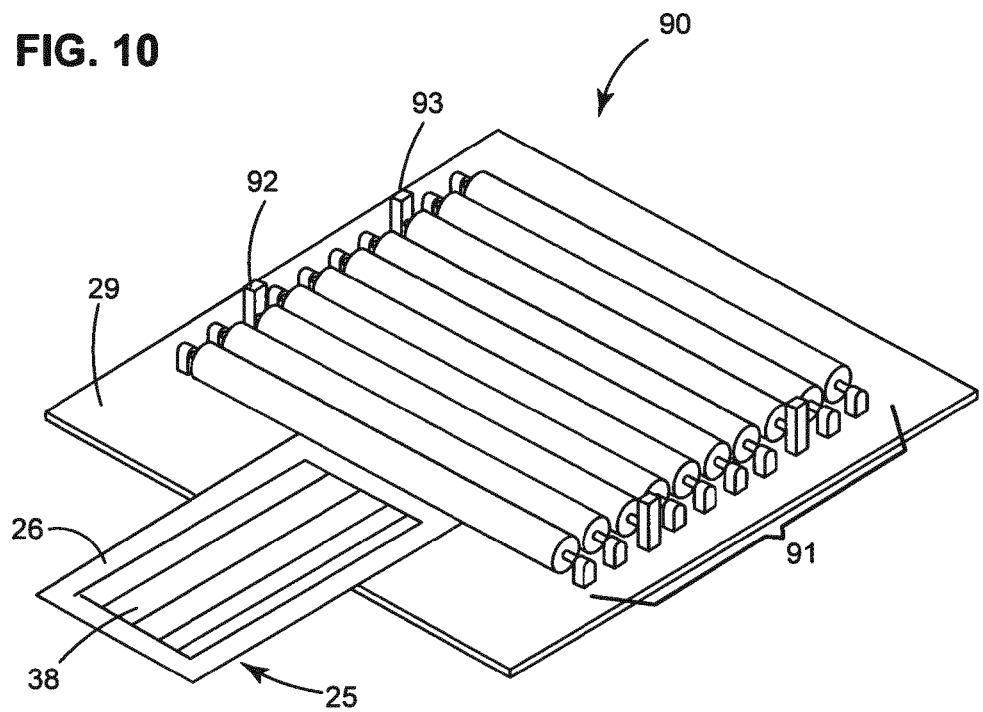
FIG. 10 is a perspective view of a first alternative embodiment of a roll laminator.

FIG. 10 is a perspective view of an alternative embodiment of a roll laminator 90 that comprises a plurality of rollers 91 of different thicknesses 92 and 93. This plurality of rollers 91 may be substituted in the carriage 50 (FIGS. 3-9) for the rollers 21 and 30 described above. In such an embodiment, the plurality of rollers 91 may comprise at least one roller having a different diameter than another roller in the plurality of rollers. In such an embodiment, the plurality of rollers 91 may comprise at least one roller having predetermined surface contours, e.g., thicker proximate the roller edges, to selectively apply higher compressive force (23 in FIG. 2) to better seal edge regions of an optoelectronic device. In such an embodiment, the plurality of rollers 91 may comprise at least one roller, or combinations of rollers, having heat or no heat.

FIGS. 11, 12, 13, 14, 15, 16, 17 and 18 illustrate operation of an embodiment of another laminator 100. Like reference numbers are used throughout these Figures.

In combination these figures illustrate an optional carriage 50 that moves between a first position 117, a second position 119, a third position 121 and a fourth position 123; a roller 21 that may be coupled with the carriage 50 and/or optionally heated; a vacuum platen 29 that may be heated; one or more actuators 72 that move the vacuum platen 29 between a first position 113 and a second position 115; a first feed roll 101; a take-up roll 105; a second feed roll 103; a first sheet 25 (front sheet) that is tensioned between the first feed roll 101 and the take-up roll 105 to be substantially flat; a second sheet 26 (backsheet) that is tensioned between the second feed roll 103 and the take-up roll 105 to be positioned at a predetermined angle θ relative to the first sheet 25; a first clamp (or web roller) 107; a second clamp (or web roller) 109; a third clamp (or web roller) 111; an area 125 of the second sheet 26 proximate the roller 21; and one or more optoelectronic devices 38, which are affixed to either the first sheet 25, the second sheet 26 or a combination thereof.

Figure 11:
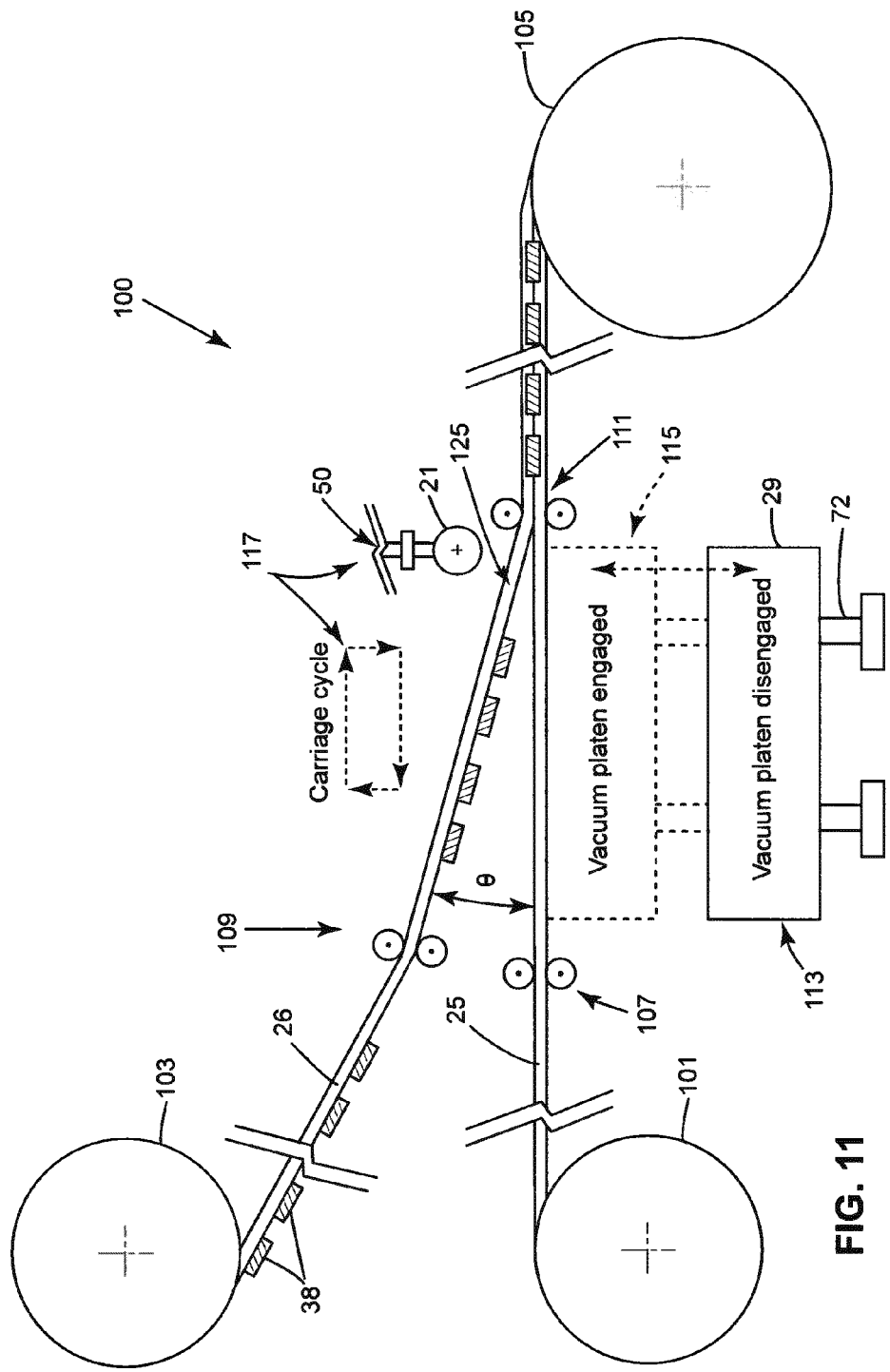
FIG. 11 is a diagram illustrating a second alternative embodiment of a roll laminator, with a movable assembly and/or roller in a first position, a platen in a first position, a first sheet tensioned between a first feed roll and a take-up roll, and a second sheet tensioned between a second feed roll and the take-up roll, wherein the second sheet is positioned at a predetermined angle relative to the first sheet.

In FIG. 11, the carriage 50 and/or roller 21 are in the first position 117. A platen 29 is in a first position 113. A first sheet 25 (front sheet) is tensioned between a first feed roll 101 and a take-up roll 105. And a second sheet 26 (backsheet) is tensioned between a second feed roll 103 and the take-up roll 105.

The second sheet 26 is positioned at a predetermined angle θ relative to the first sheet 25. This angle θ may dynamically vary within a predetermined range as the carriage 50 and/or the roller 21 move across the second sheet 26 to hermetically encapsulate the optoelectronic device(s) 38 between the first sheet 25 and the second sheet 26. What is important is that a single portion of the second sheet 26 proximate the roller 21 contacts the first sheet 25 as the roller 21 moves across the second sheet 26. This ensures hermetic lamination and prevents either or both of the first sheet 25 and the second sheet 26 from wrinkling.

The one or more actuators 72 are coupled with the platen 29 and make the platen 29 movable from its first position 113 to its second position 115, which is adjacent the first sheet 25. When the platen 29 is in the second position 115, vacuum pressure (and/or positive balancing pressure) may be applied to the platen 29. The positive balancing pressure, if applied, helps counteract the forces applied by the carriage 50 and/or the roller 21. The vacuum pressure, when applied, helps hold and smooth the first sheet 25 against a flat surface of the platen 29. This minimizes the stresses on the front sheet 25 and minimizes wrinkles and gas bubbles during the encapsulation of the one or more optoelectronic devices 38.

The first sheet 25 is tensioned and/or fed through the first clamp (or web roller) 107 and the second clamp (or web roller) 111. The second sheet 26 is tensioned and/or fed through the third clamp (or web roller) 109 and the second clamp (or web roller) 111.

Referring to FIGS. 11, 12, 13, 14, 15, 16 and 17, an embodiment of the laminator 100 operates as follows.

In FIG. 11, the platen 29 begins in its first position 113, retracted away from the tensioned, substantially flat first sheet 25. The carriage 50 and/or roller 21 start in first position 117, where the roller 21 is positioned proximate a point where the second sheet 26 joins the first sheet 25. When in this first position 117, the roller 21 may or may not contact the second sheet 26. If contact is made, however, the pressure (if any) applied by the roller 21 to the second sheet 26 does not place an area (125 in FIGS. 11, 12) of the second sheet 26 proximate the roller 21 in contact with the first sheet 25.

Figure 12:
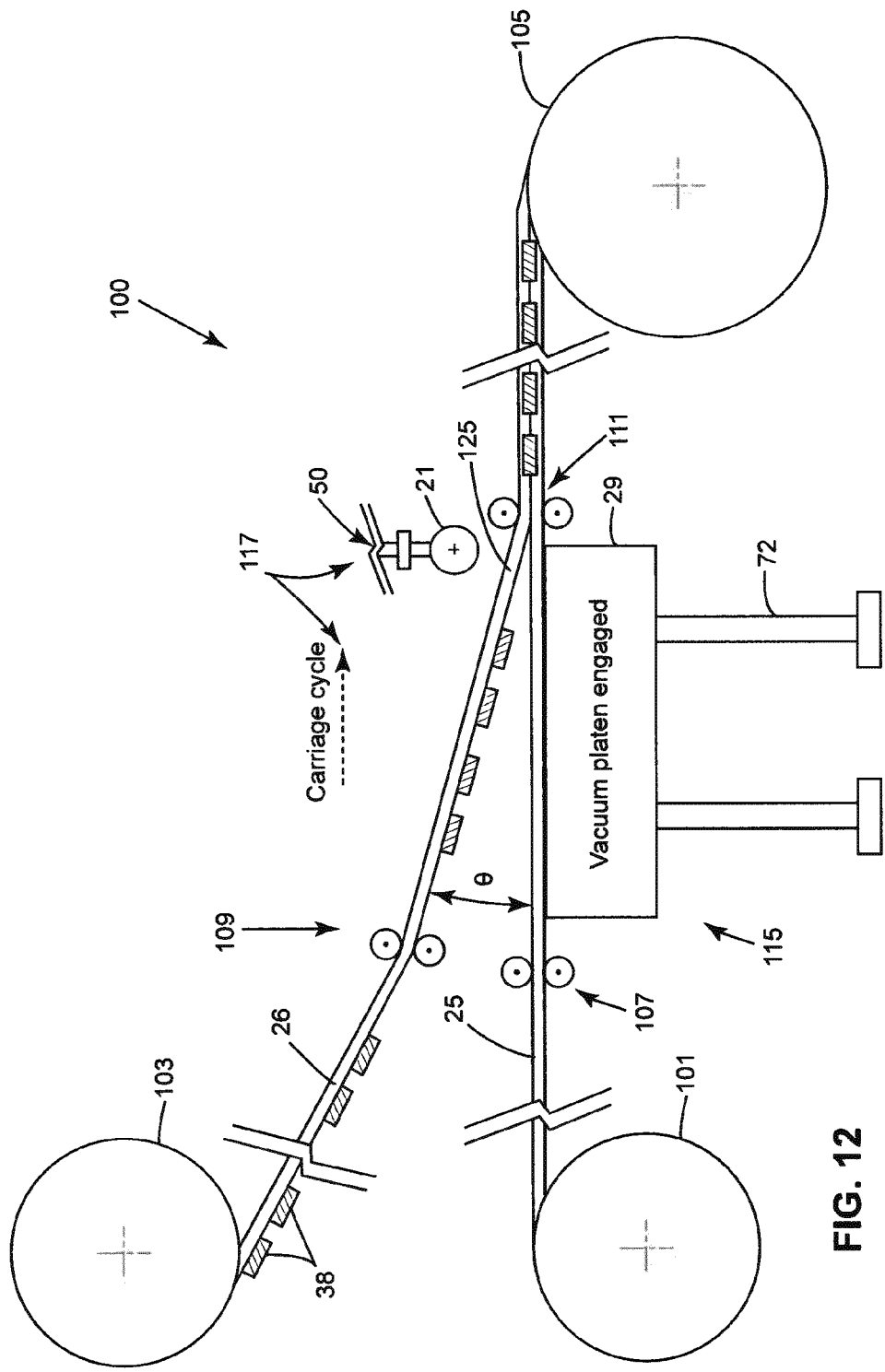
FIG. 12 is a diagram of the second alternative embodiment of the laminator of FIG. 11, with the movable assembly and/or roller in the first position and the platen in a second position.

In FIG. 12 the carriage 50 and/or roller 21 remain the first position 117 while the actuators 72 move the platen 29 to its second position 115 adjacent the first sheet 25. Vacuum pressure is applied to smooth the first sheet 25 along a flat surface of the platen 29. Optionally, the platen 29 may be heated to relax the first sheet 25 and/or to activate a heat-cure adhesive positioned between the first sheet 25 and the second sheet 26.

Figure 13:
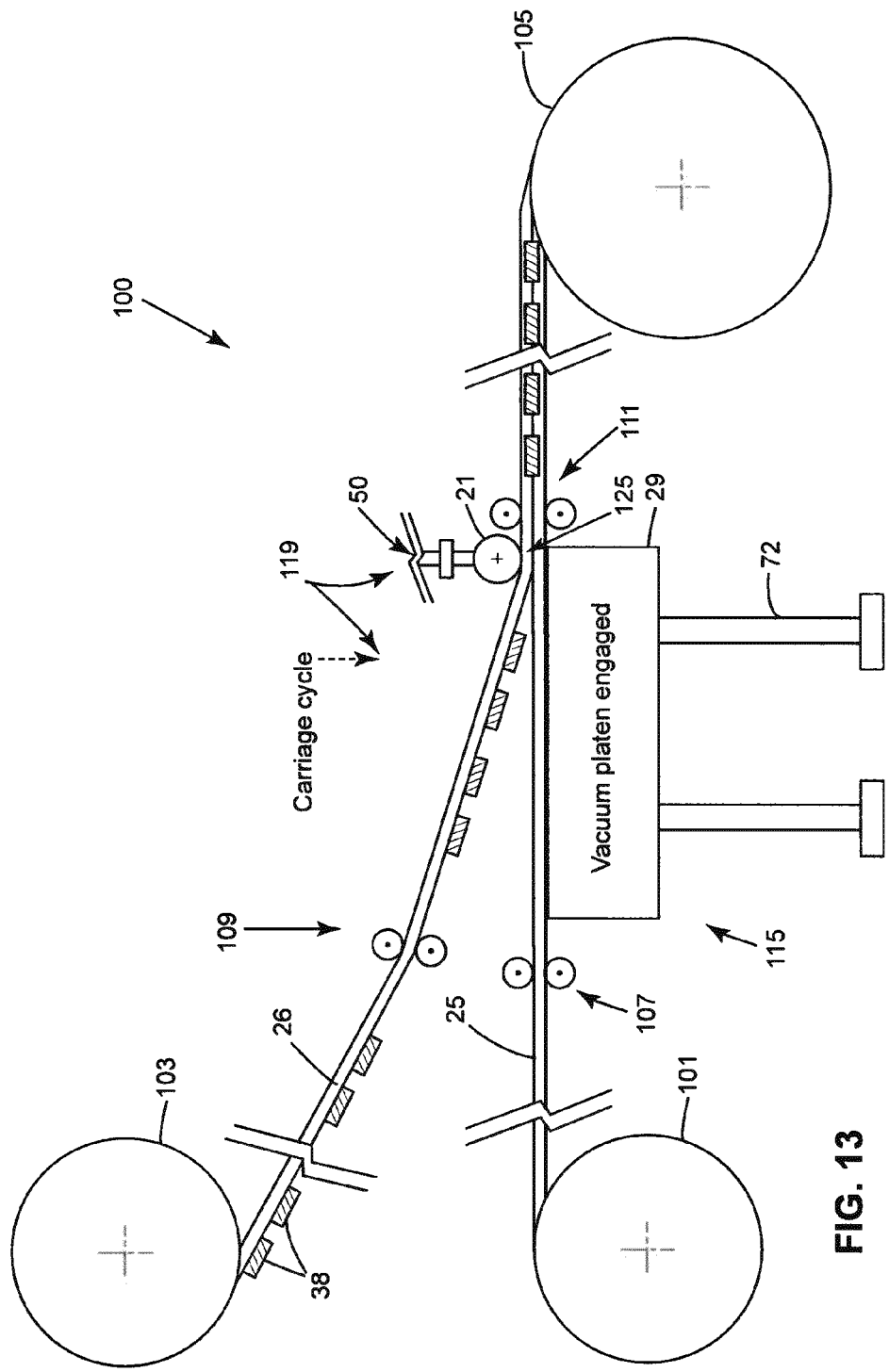
FIG. 13 is a diagram of the second alternative embodiment of the laminator of FIG. 11, with the platen in the second position and the movable assembly and/or roller in a second position.

In FIG. 13 the platen 29 remains in the second position 115 and the carriage 50 and/or roller 21 move to its second position 119. In this second position 119, the roller 21 contacts the second sheet 26 (at area 125). Pressure is applied via the roller 21 to press the area 125 of the second sheet 26 against a corresponding area of the substantially flat first sheet 25. Optionally, the roller may be heated to relax the second sheet 26 and/or to activate a heat-cure adhesive positioned between the first sheet 25 and the second sheet 26.

Figure 14:
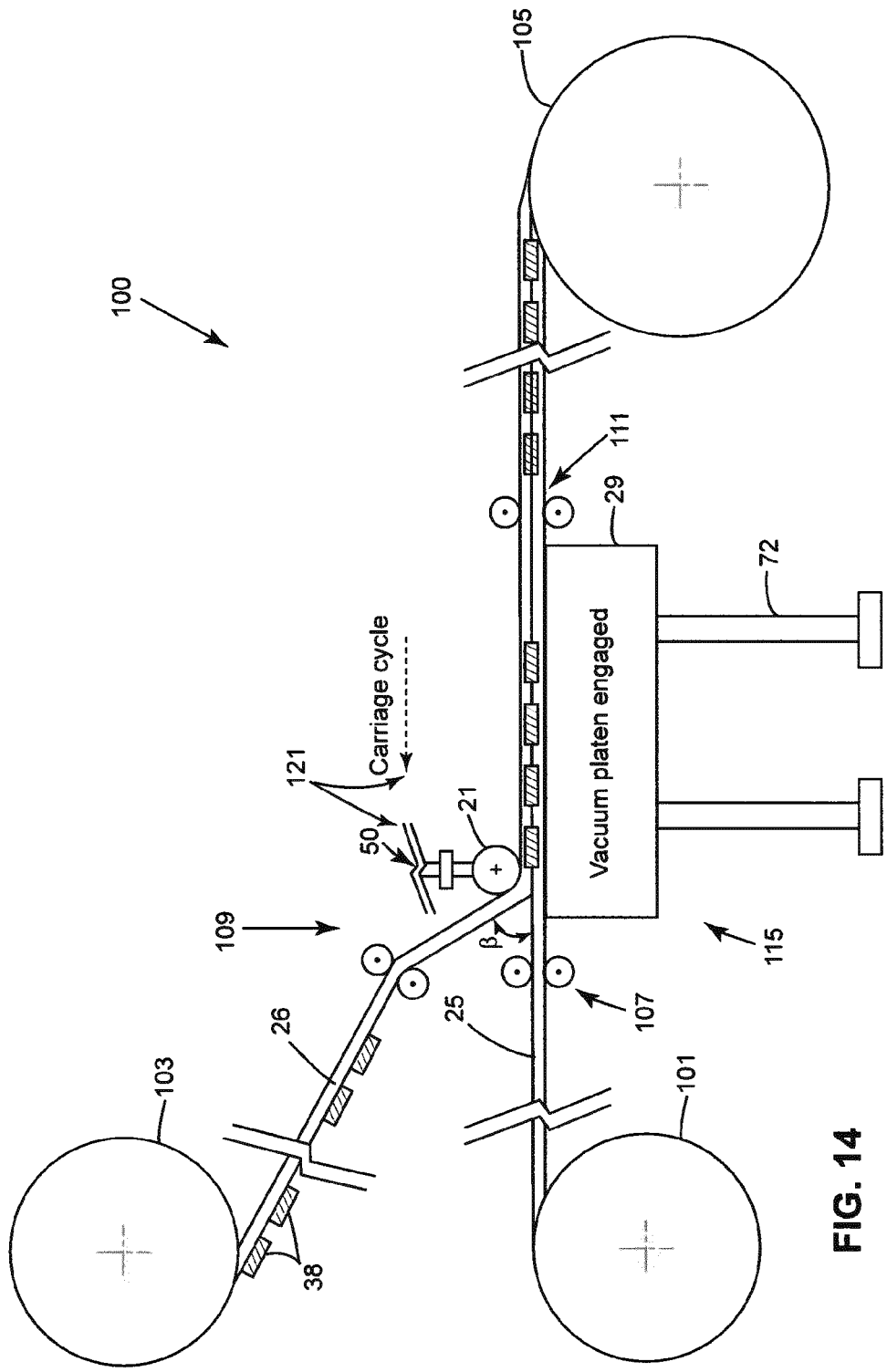
FIG. 14 is a diagram of the second alternative embodiment of the laminator of FIG. 11, with the platen in the second position and the movable assembly and/or roller in a third position.

In FIG. 14 the platen 29 remains in the second position 115 while the carriage 50 and/or roller 21 moves across the second sheet 26 to a third position 121. As the roller 21 moves across the second sheet 26, pressure from the roller 21 presses the angled second sheet 26 against the first sheet 25 so that one or more optoelectronic devices 38 are hermetically encapsulated between the first sheet 25 and the second sheet 26. As the roller 21 moves, the value of the predetermined angle θ may change to angle β, as shown.

Figure 15:
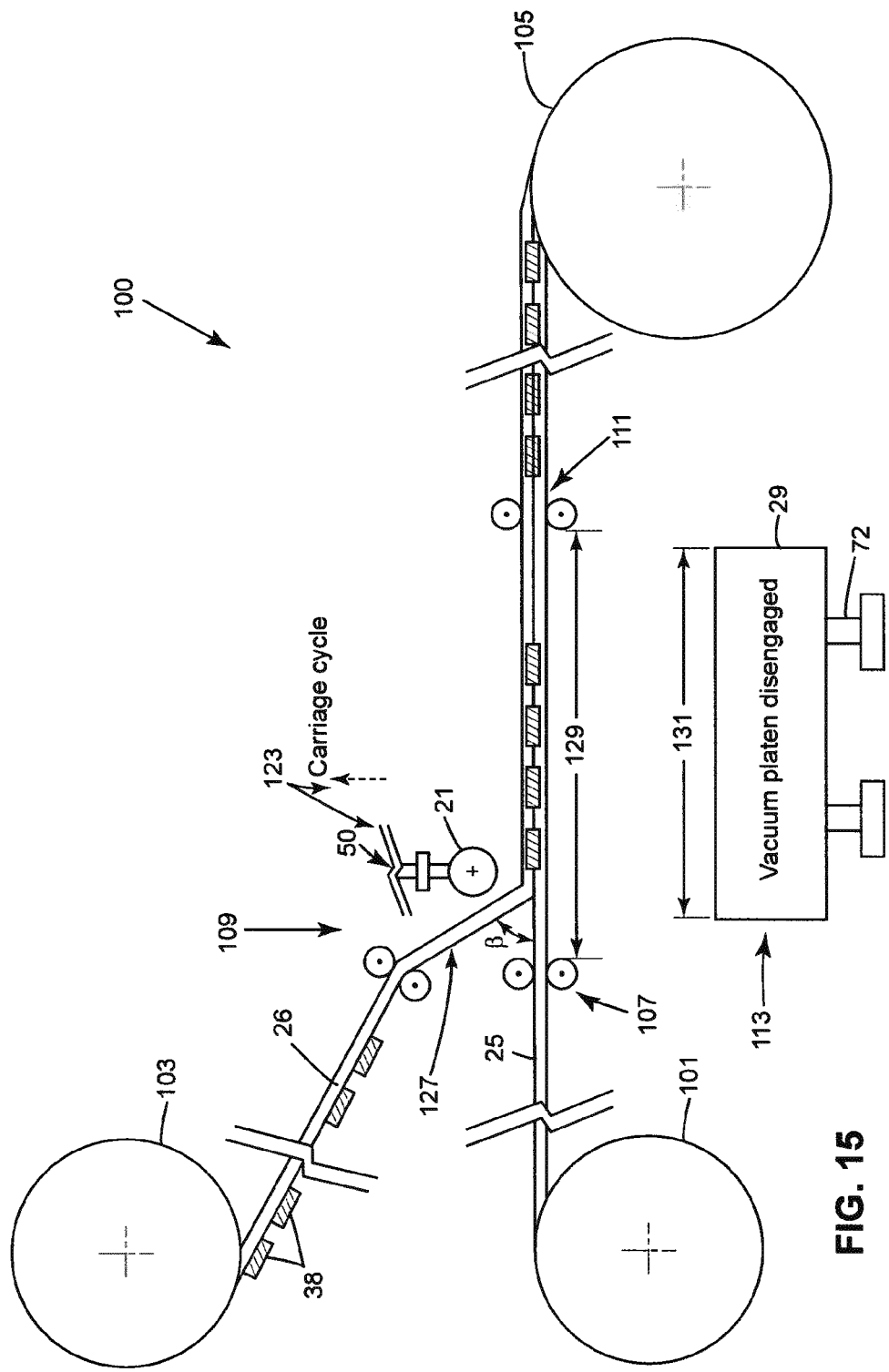
FIG. 15 is a diagram of the second alternative embodiment of the laminator of FIG. 11, with the platen in the first position and the movable assembly and/or roller in a fourth position.

In FIG. 15, once the roller 21 and/or carriage 50 reaches the third position 121, they are pulled away to a fourth position 123 (or optionally diagonally back to the first position 117). The vacuum pressure applied to the platen 29 is stopped, and the one or more actuators 72 return the platen 29 to its first position 113, away from the first sheet 25. Optionally, to speed cycle times, the platen 29 and/or the roller 21 may be cooled using one or more coolants, such as liquid nitrogen. As shown in FIG. 15, groups of optoelectronic devices 38 may be separated by a predetermined distance 127 (or length of the second sheet 26 (or the first sheet 25). This distance 127 approximately corresponds to the (a) distance 129 traveled by the roller 21 across the second sheet 26 from the second position 119 to the third position 121 and/or (b) a length 131 of the platen 29. The take-up roll 105 rotates to pull the first sheet 25 and the second sheet 26 about the distance 129 or the length 131 of the platen 29, until the angled junction of the second sheet 26 and the first sheet 25 are proximate the second clamp (or web roller) 111. As the encapsulated optoelectronic devices 38 move past the second clamp (or web roller) 111, the angle β dynamically changes back to angle θ (FIG. 16).

Figure 16:
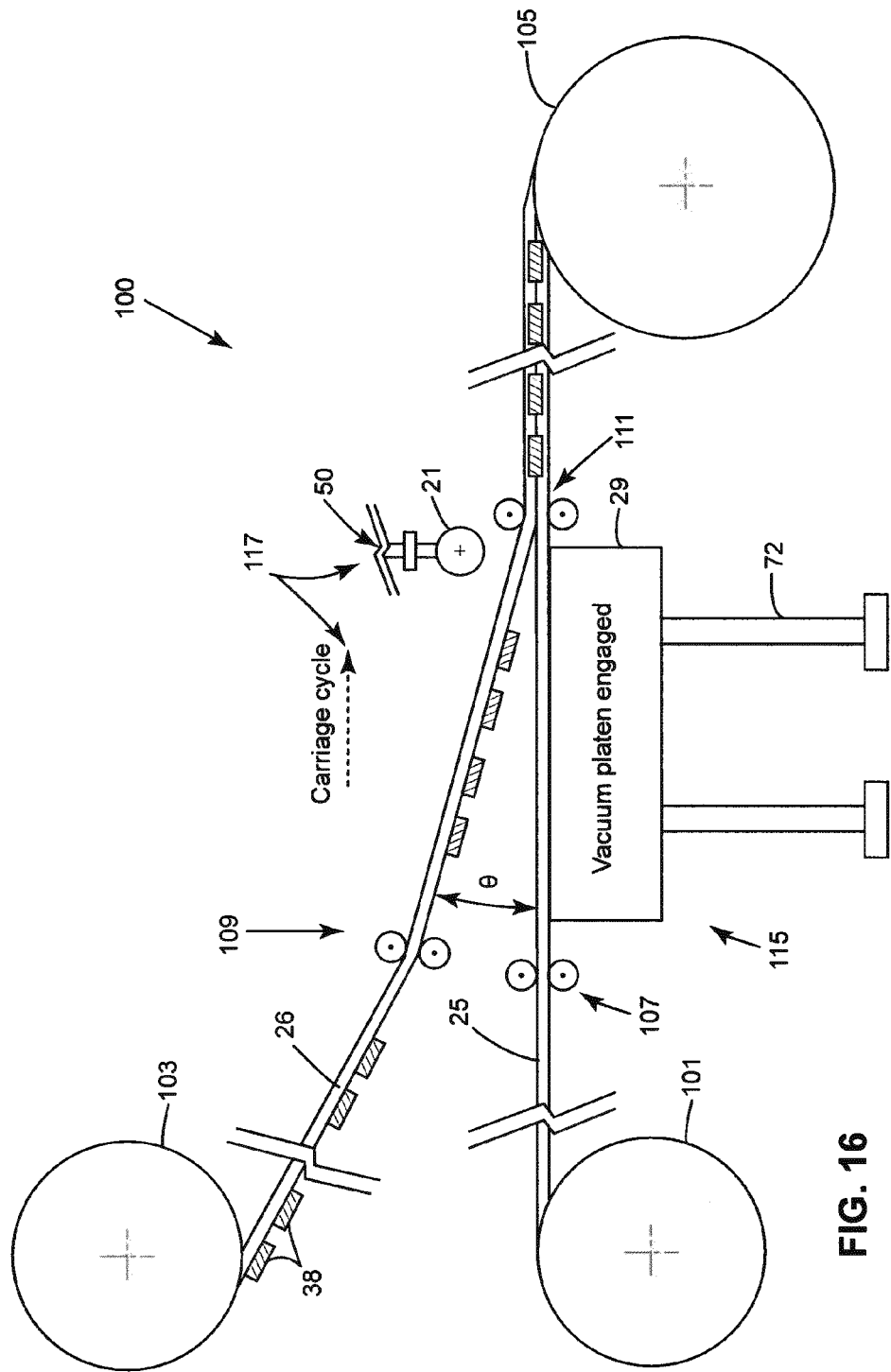
FIG. 16 is a diagram of the second alternative embodiment of the laminator of FIG. 11, with the platen in the second position and the movable assembly and/or roller returned to the first position.

In FIG. 16, the one or more actuators 72 move the platen 29 back to the second position 115 as the carriage 50 and/or roller 21 returns to the first position 117. Thereafter, the process described above may repeat until the feed rolls 101 and 103 or take-up roll 105 require changing.

Figure 17:
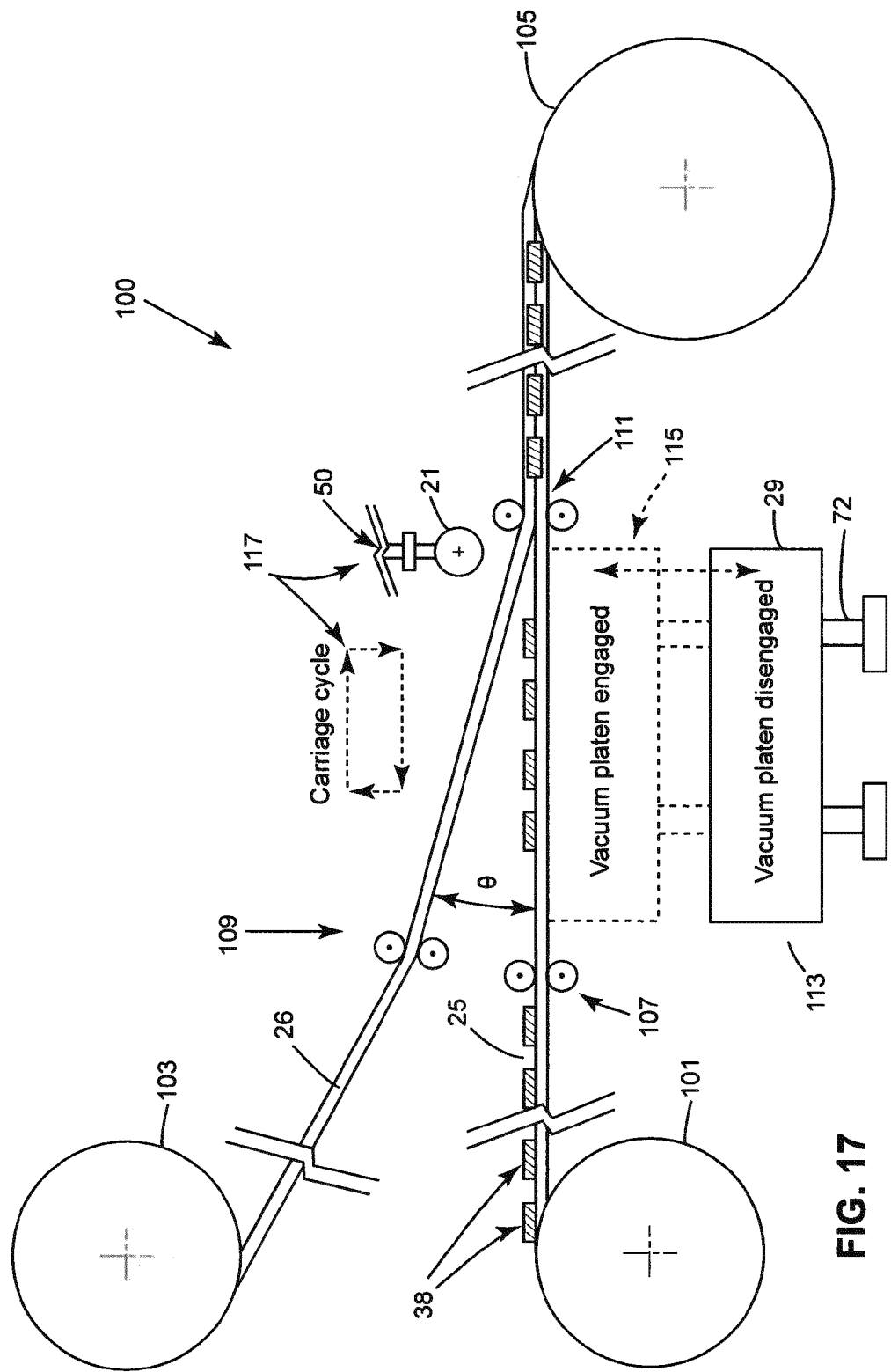
FIG. 17 is a diagram of the second alternative embodiment of the laminator of FIG. 11, but with one or more optoelectronic devices positioned on the front sheet.

FIG. 17 is a diagram of the second alternative embodiment of the laminator 100 of FIG. 11, but with one or more optoelectronic devices positioned on the front sheet. Operation of the embodiment depicted in FIG. 17 is as described above with respect to FIGS. 11, 12, 13, 14, 15 and 16.

Figure 18:
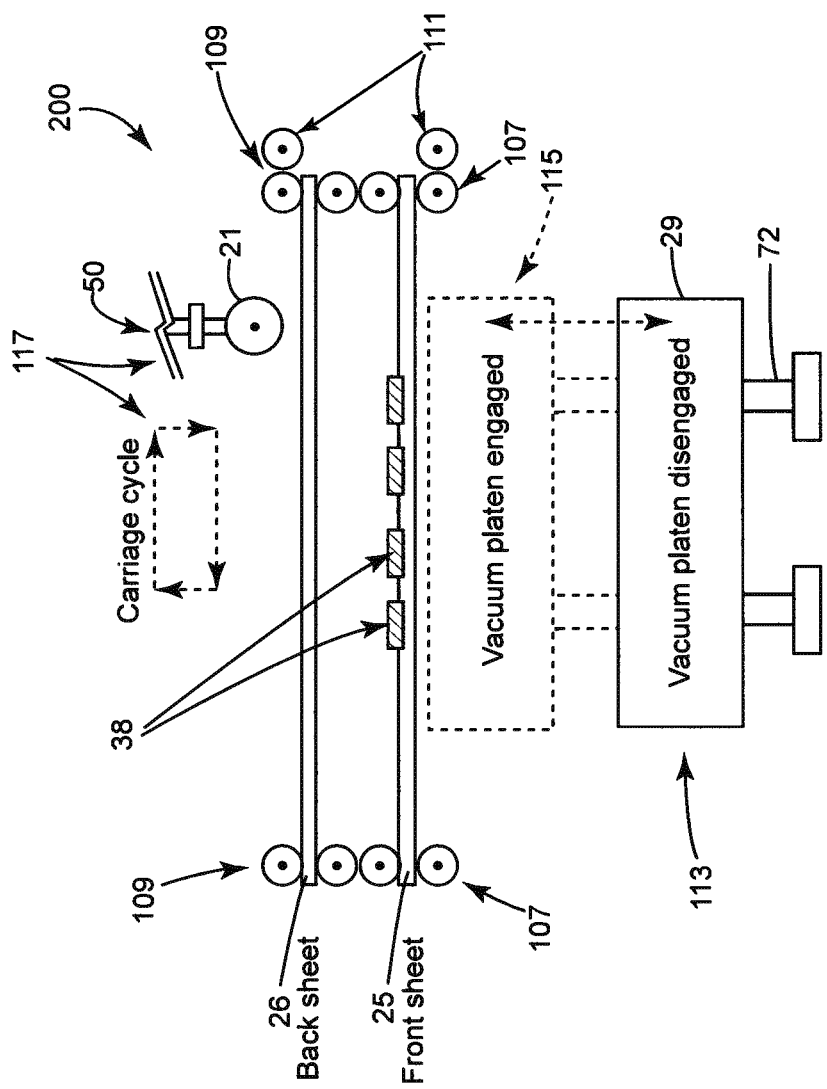
FIG. 18 is a diagram of a third alternative embodiment of a laminator, with a platen positioned in a first position, a first sheet tensioned between first clamps, a second sheet tensioned between second clamps, spaced apart from the first sheet, and substantially parallel to the first sheet.

FIG. 18 is a diagram of a third alternative embodiment of a laminator 200. As shown, the first sheet 25 is tensioned between a pair of first clamps (or web rollers) 107, and the second sheet 26 is tensioned between a pair of second clamps (or web rollers 109). The second sheet 26 is positioned substantially parallel the first sheet 25. One or more optoelectronic devices 38 are affixed to the front sheet 25. Operation of this embodiment is substantially the same as described above with respect to FIGS. 11, 12, 13, 14, 15, 16, and 17, with the carriage 50 and/or roller 21 moving in a carriage cycle, beginning with a first position 117.

An additional pair of clamps (web rollers) 111 may optionally be positioned adjacent to 109 and 107 on the right side. When an encapsulation is completed, the clamps (web rollers) 111 engage the lamination while clamps 109 and 107 disengage. The new clamps 111 drive the encapsulated product all the way through. When new materials are in place, the new clamps 111 disengage and the right clamps 109 and 107 re-engage.

Alternatively, the bottom of 109 and top of 107 disengage, followed by top of 109 engaging to bottom of 107 to drive the encapsulated web through.

This assumes, of course, that clamp/web rollers 107, 109 (and/or 111) can dynamically re-position in x, y, and z directions.

Referring back to FIGS. 11, 12, 13, 14, 15, 16, 17, and 18, the clamps 107, 109 and 111 are used to keep the first sheet 25 and/or the second sheet 26 under tension during encapsulation. In one embodiment, the tension prevents the second sheet 26 from sagging and touching the first sheet 25 before the carriage 50 and/or the roller 21 makes the encapsulation.

Web drives may be used to drive the first sheet 25 and/or the second sheet 26 before, during, and after encapsulation.

The mechanism for clamping and the mechanism for driving the first sheet 25 and the second sheet 26 may be the same. For example, this mechanism may be a roller (e.g., a tensioner) or a pair of rollers that pinch the first sheet 25 and/or the second sheet 26. The mechanism may clamp only the web or may clamp across a width of the first sheet 25 and/or a width of the second sheet 26. In such an embodiment, the mechanism is coated with a non-stick material.

In one embodiment, the first clamp 109 is on a floating track that maintains the angle θ throughout the encapsulation, as the clamp 109 moves ahead of the carriage 50 and/or the roller 21. Alternatively, as previously described above, the clamp 109 is stationary, in which case the angle θ may change dynamically as the carriage 50 and/or the roller 21 move. Consequently, the initial angle θ may range from about 0° to about 170°. In one embodiment, the range is about 5° to about 10°.

As in the embodiments described in FIGS. 1, 2, 3, 4, 5, 6, 7, 8, 9 and 10, the carriage 50 may comprise one or more rollers 21. If more than one roller is used, one or more of them may be heated and/or cooled (using a liquid coolant such as liquid nitrogen). In such an embodiment, the first roller in the group of rollers may be heated.

The optoelectronic devices 38 may be autonomously or manually placed on the first sheet 25 and/or the second sheet 26 before encapsulation.

Figure 19:
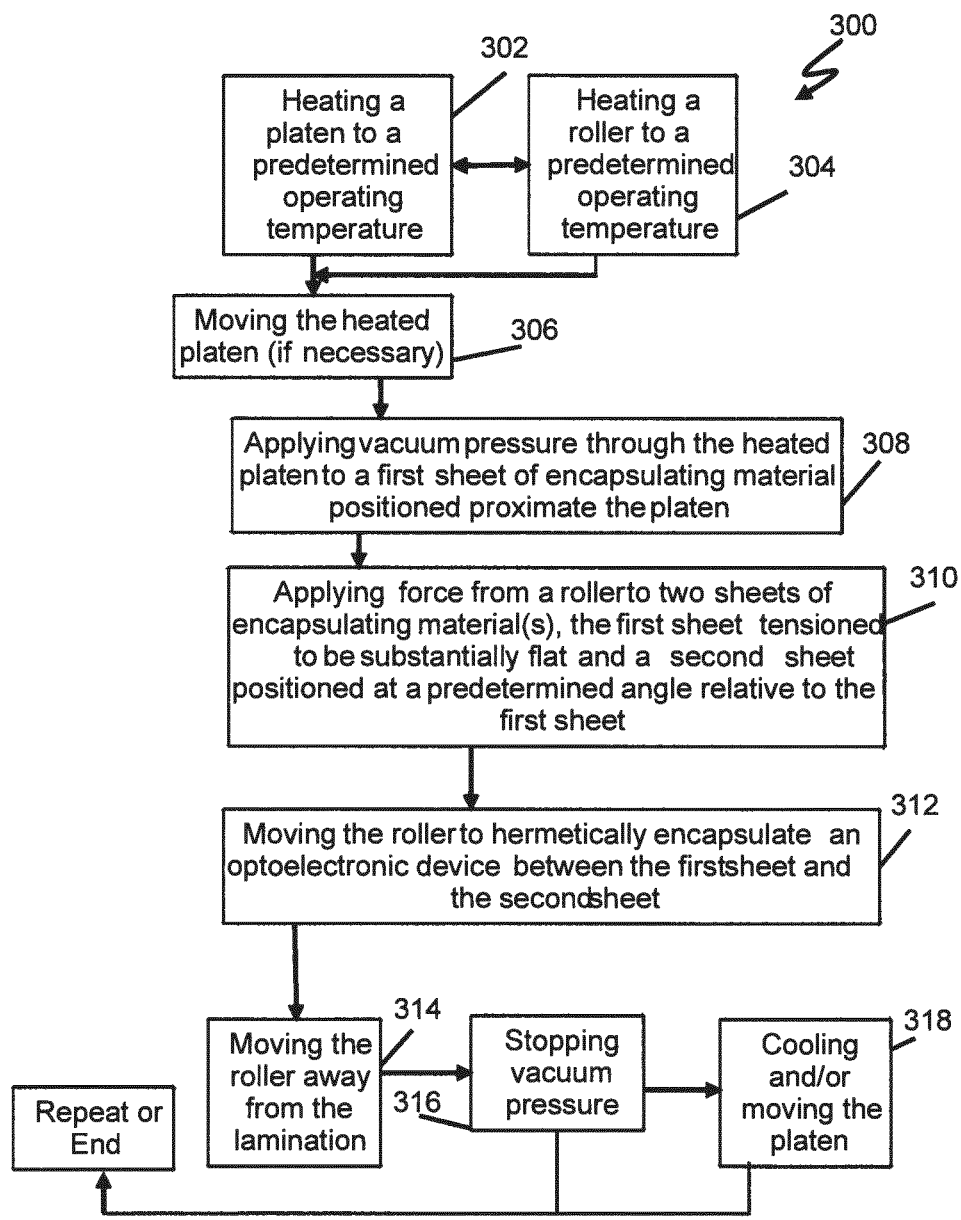
FIG. 19 is a flowchart of an embodiment of a method that may be used to hermetically encapsulate one or more optoelectronic devices between a first sheet and a second sheet of encapsulating materials.

FIG. 19 is a flowchart of an embodiment of a method 300 that may be used to hermetically encapsulate one or more optoelectronic devices between a first sheet 25 and a second sheet 26 of encapsulating materials. Unless indicated otherwise, the steps of method 300 can be performed in any suitable order. However, when performing embodiments of the method 300, care should be taken to limit the encapsulating materials' exposure to heat, especially if an optoelectronic device 38 is on that sheet. Thus, the lamination sequence should begin after the platen 29 and roller 21 are at operating temperatures.

Accordingly, in one embodiment, the method 300 begins by heating 302 the platen 29 to a first predetermined operating temperature before it engages (e.g., moves adjacent the first sheet) and before roller pressure is applied. The method 300 may further include heating 304 the roller 21 to a second predetermined operating temperature. These predetermined operating temperatures will vary depending on the types of encapsulating materials used. The predetermined operating temperatures of the platen 29 and roller 21 may be the same or different.

The method 300 may further include moving 306 the heated platen 29, if necessary, to be proximate a taut non-stick sheet or a tensioned first sheet of encapsulating material. The method 300 further includes applying 308 vacuum pressure through the heated platen 29 (and, in one embodiment, the taut non-stick sheet) to the first sheet 25 of encapsulating material. The method 300 further includes applying 310 force from the heated roller 21 to two sheets of encapsulating material(s)—the first sheet 25, which may be tensioned to be substantially flat, and a second sheet 26, which is positioned at a predetermined angle relative to the first sheet 25. The method 300 further includes moving 312 the roller 21 to hermetically encapsulate an optoelectronic device 38 between the first sheet 25 and the second sheet 26.

Once the lamination is complete, the method 300 may further include moving 314 the roller 21 away from the lamination, stopping 316 the vacuum pressure, and cooling and/or moving 318 the platen 29 away from the lamination. Thereafter, the method 300 may repeat or end.

Figure 20:
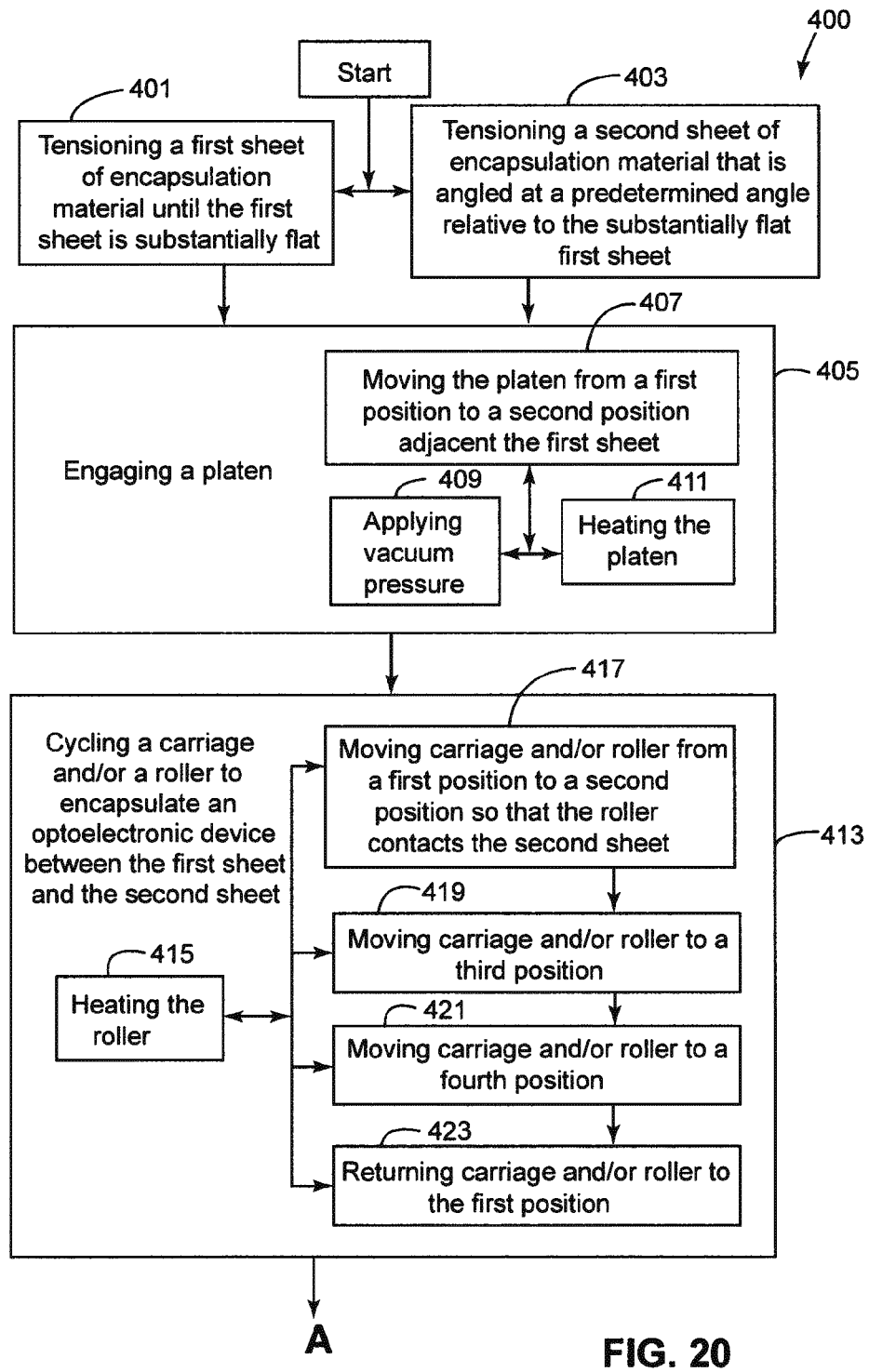
FIGS. 20 and 21 are a flowchart of another embodiment of a method that may be used to hermetically encapsulate one or more optoelectronic devices between a first sheet and a second sheet of encapsulating materials.
Figure 21:
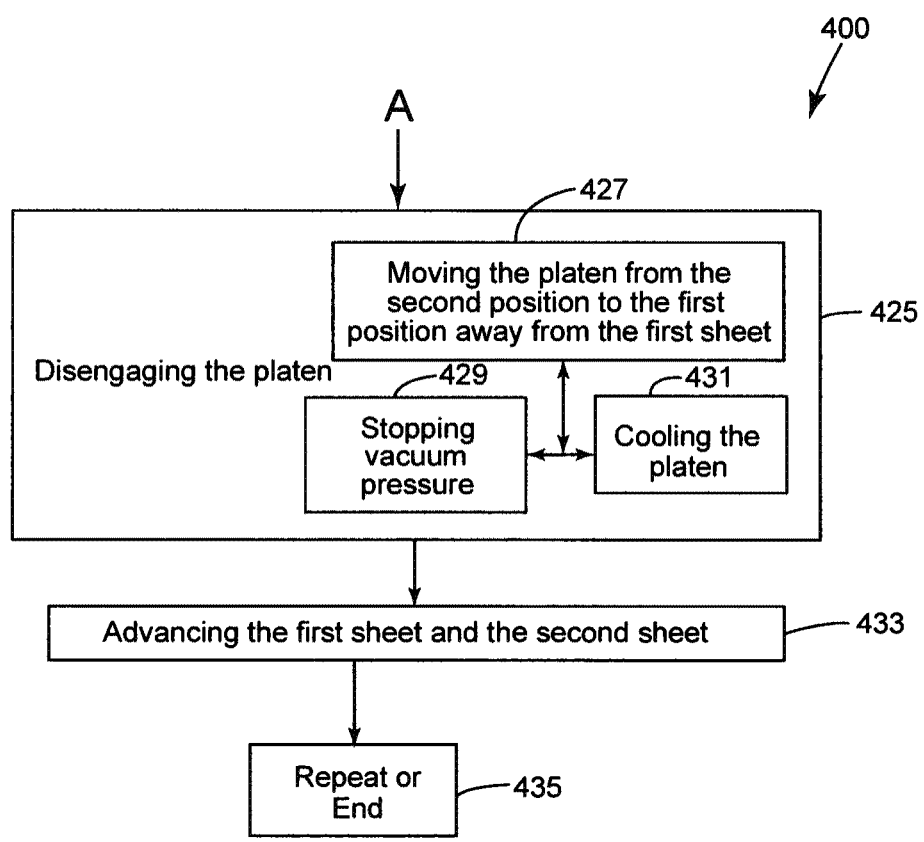

FIGS. 20 and 21 are a flowchart of another embodiment of a method 400 that may be used to hermetically encapsulate one or more optoelectronic devices 38 between a first sheet 25 and a second sheet 26 of encapsulating materials. The method 400 may optionally begin by either tensioning 401 the first sheet 25 of encapsulation material until the first sheet 25 is substantially flat or by tensioning 403 a second sheet 26 of encapsulation material that is angled at a predetermined angle relative to the substantially flat first sheet 25.

The method 400 may further comprise engaging 405 a platen. This step may further comprise moving 407 the platen 29 from a first position 113 to a second position 115 adjacent the first sheet 25; applying vacuum pressure 409 through the platen 29 to smooth and/or flatten the first sheet 25; and/or heating 411 the platen 29 and/or the roller 21.

The method 400 may further comprise cycling the carriage 50 and/or roller 21 to encapsulate an optoelectronic device 38 between the first sheet 25 and the second sheet 26. This step may further comprise heating 415 the roller 21. This step may further comprise moving 417 the carriage 50 and/or the roller 21 from a first position 117 to a second position 119 so that the roller 21 contacts the second sheet 26. This step may further comprise moving 419 the carriage 50 and/or roller 21 to a third position 121. This step may further comprise moving 421 the carriage 50 and/or roller 21 to a fourth position 123, and/or returning 423 the carriage 50 and/or roller 21 to the first position 117.

The method 400 may further comprise disengaging 425 the platen 29. This step may further comprise moving 427 the platen 29 from the second position 115 to the first position 113, away from the first sheet 25. This step may further comprise stopping 429 the vacuum pressure and/or cooling 431 the platen 29.

The method 400 may further comprise advancing 433 the first sheet 25 and the second sheet 26. Thereafter, the method 400 may repeat or end, as represented by block 435.

As used herein, the terms "flat" and "substantially flat" imply a radius of curvature greater than about 15.2 cm.

FIG. 22 is a perspective, exploded view of an illustrative encapsulated optoelectronic device 500 that may be produced using one or more embodiments of the laminator 20 described herein. By way of example only, and not limitation, the optoelectronic device 38 comprises an organic light emitting diode (OLED). The vacuum laminator 20 can also manufacture other encapsulated optoelectronic devices 38, such as photovoltaic devices.

From bottom to top of FIG. 22, the exemplary encapsulated optoelectronic device 500 may include a mask 501, a flat flex cable 502, low temperature solder 503, first insulating rings 504, a backsheet 26, second insulating rings 505, contact patches 506, first Anisotropic Conductive Film (ACF) strips 507, a supplemental bus 508, second ACF strips 509, an optoelectronic device (OLED) 38, an optical coupler 510, a barrier film 511, an out-coupling adhesive 512, and an out-coupling film 513. In one embodiment the backsheet 26 has a thermally activated or pressure sensitive adhesive on the surface closest to the optoelectronic device 38.

In one embodiment, some or all of these components are pre-assembled, compressed, and adhered together prior to encapsulating the optoelectronic device 38. For example, the optical coupler 510, the barrier film 511, the out-coupling adhesive 512, and the out-coupling film 513 may be pre-assembled to form a single "front sheet" (25 in FIG. 2). Similarly, the optoelectronic device 38, the first insulating rings 504, the backsheet 26, second insulating rings 505, contact patches 506, first Anisotropic Conductive Film (ACF) strips 507, supplemental bus 508, second ACF strips 509 can be pre-assembled to form a single "back sheet" (26 in FIG. 2). In one embodiment the flat flex cable 502 is soldered to the patches 506 after the optoelectronic device 38 is hermetically sealed, and then the mask 501 is applied.

As used herein, an element or function recited in the singular and preceded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the scope of the following claims.

What is claimed is:

1. A method, comprising:
    applying force from a roller to two sheets of encapsulating material(s), a first sheet tensioned to be substantially flat and a second sheet positioned at a predetermined angle relative to the first sheet; and
    moving the roller to hermetically encapsulate an optoelectronic device between the first sheet and the second sheet;
    the method further comprising:
    heating a platen, the platen having a flat surface with one or more holes therein; and
    moving the platen from a first position away from the first sheet of encapsulating material to a second position proximate the first sheet of encapsulating material.

2. The method of claim 1, further comprising:
    applying vacuum pressure through the platen to smooth the first sheet of encapsulating material against the flat surface of the platen.

3. The method of claim 1, further comprising:
    applying vacuum pressure through holes in a tensioned non-stick sheet positioned adjacent the platen to smooth the first sheet of encapsulating material against the tensioned non-stick sheet and the flat surface of the platen.

4. The method of claim 1, wherein the two sheets of encapsulating material(s) are a front sheet and a back sheet, and the optoelectronic device is selected from one of an OLED and a photovoltaic device.

5. A method, comprising:
    applying force from a roller to two sheets of encapsulating material, a first sheet tensioned to be substantially flat and a second sheet positioned at a predetermined angle relative to the first sheet; and
    moving the roller to hermetically encapsulate an optoelectronic device between the first sheet and the second sheet;
    wherein the method further comprises:
    moving a platen having a flat surface with one or more holes therein, from a first position away from the first sheet of encapsulating material to a second position proximate the first sheet of encapsulating material.

6. The method of claim 5, further comprising: heating the platen.

7. A method, comprising:
    applying force from a roller to two sheets of encapsulating material, a first sheet tensioned to be substantially flat and a second sheet positioned at a predetermined angle relative to the first sheet; and
    moving the roller to hermetically encapsulate an optoelectronic device between the first sheet and the second sheet;
    wherein the method further comprises:
    moving a platen having a flat surface with one or more holes therein, from a first position away from the first sheet of encapsulating material to a second position proximate the first sheet of encapsulating material; and
    applying vacuum pressure through the platen to smooth the first sheet of encapsulating material against the flat surface of the platen.

8. The method of claim 7, further comprising: heating the platen.

\* \* \* \* \*